United States Patent
Giancristofaro et al.

(10) Patent No.: US 11,526,396 B2
(45) Date of Patent: Dec. 13, 2022

(54) MINIMUM-SIZE BELIEF PROPAGATION NETWORK FOR FEC ITERATIVE ENCODERS AND DECODERS AND RELATED ROUTING METHOD

(71) Applicant: Thales Alenia Space Italia S.p.A. Con Unico Socio, Rome (IT)

(72) Inventors: Domenico Giancristofaro, Rome (IT); Massimo Fonte, Rome (IT)

(73) Assignee: Thales Alenia Space Italia S.p.A. Con Unico Socio, Rome (IT)

( * ) Notice: Subject to any disclaimer, the term of this patent is extended or adjusted under 35 U.S.C. 154(b) by 361 days.

(21) Appl. No.: 16/612,959

(22) PCT Filed: May 11, 2018

(86) PCT No.: PCT/EP2018/062266
§ 371 (c)(1),
(2) Date: Nov. 12, 2019

(87) PCT Pub. No.: WO2018/206803
PCT Pub. Date: Nov. 15, 2018

(65) Prior Publication Data
US 2020/0081766 A1 Mar. 12, 2020

(30) Foreign Application Priority Data
May 12, 2017 (IT) .................. 102017000051944

(51) Int. Cl.
*G06F 11/10* (2006.01)
*G06F 13/40* (2006.01)

(52) U.S. Cl.
CPC .......... *G06F 11/10* (2013.01); *G06F 13/4022* (2013.01); *G06F 13/4027* (2013.01); *H04Q 2213/13076* (2013.01)

(58) Field of Classification Search
CPC ................. G06F 11/10; G06F 13/4022; H04Q 2213/13076
(Continued)

(56) References Cited

U.S. PATENT DOCUMENTS

| 4,653,019 A | 3/1987 | Hodge et al. |
| 4,807,280 A * | 2/1989 | Posner ..................... H04Q 3/68 379/272 |

(Continued)

OTHER PUBLICATIONS

Berrou et al., "*Near Shannon Limit error-correcting coding and decoding; Turbo Codes*", IEEE International Conference on Communications (ICC) 1993, Geneva, Switzerland, pp. 1064-1070, May 1993.

Benedetto, et al., "*Iterative decoding of serially concatenated convolutional codes*", IET (Institution of Engineering and Technology) Electronic Letters, vol. 32, Issue 13, pp. 1186-1188, Jun. 20, 1996.

(Continued)

*Primary Examiner* — Joseph D Torres
(74) *Attorney, Agent, or Firm* — McCarter & English, LLP

(57) ABSTRACT

The invention relates to an interconnection network for forward error correction encoders and decoders, including N input terminals, N output terminals, and M stages. Each stage includes switching elements having input pins and output pins. The input pins of the switching elements of the first stage are connected to the input terminals, and the output pins of the switching elements of the last stage are connected to the output terminals. The input and output pins of the switching elements of immediately successive stages are connected in a hardwired fashion so as to form a plurality of interconnection sub-networks for routing respective input values from respective output pins of the switching elements of the first stage to respective input pins of the switching elements of the last stage.

5 Claims, 19 Drawing Sheets

(a)

(b)

(58) Field of Classification Search
USPC .................................. 714/776, 775, 778, 780
See application file for complete search history.

(56) References Cited

U.S. PATENT DOCUMENTS

| | | | | |
|---|---|---|---|---|
| 5,541,914 | A * | 7/1996 | Krishnamoorthy | ... H04L 49/254 370/427 |
| 5,852,407 | A * | 12/1998 | Ishii | .................. G06F 15/17393 340/2.21 |
| 6,304,550 | B1 * | 10/2001 | Fox | .................... H04Q 11/0478 370/473 |
| 6,456,838 | B1 * | 9/2002 | Wang | ....................... H04Q 3/68 370/380 |
| 6,775,800 | B2 | 8/2004 | Edmonston et al. | |
| 6,789,218 | B1 | 9/2004 | Edmonston et al. | |
| 2001/0033584 | A1 * | 10/2001 | Dally | ....................... H04Q 3/68 370/376 |
| 2004/0234000 | A1 * | 11/2004 | Page | ..................... H04L 7/0008 375/259 |
| 2008/0063216 | A1 * | 3/2008 | Sakata | .................... H04L 7/041 381/80 |
| 2008/0285449 | A1 * | 11/2008 | Larsson | .............. H04L 49/1515 370/232 |
| 2012/0262009 | A1 * | 10/2012 | Becker | ................. G01R 1/2844 307/113 |
| 2013/0156133 | A1 | 6/2013 | Gentile et al. | |
| 2019/0327542 | A1 * | 10/2019 | Rivaud | .................. H04L 49/15 |

OTHER PUBLICATIONS

Bendetto et al., "*Soft-Input Soft-Output Modules for the Construction and Distributed Iterative Decoding of Code Networks*", European Transaction on Communications, vol. 9, No. 2, Jan. 1998.
Dolinar et al., "*Code Performance as a Function of Block Size*", TMO Progress Report, pp. 42-133, May 15, 1998.
Richardson, et al., "*The renaissance of Gallager's low-density parity-check codes*", IEEE Communications Magazine, vol. 41, Issue 8, pp. 126-131, Aug. 2003.
Benedetto et al., "*MHOMS: High Speed ACM Modem for Satellite Applications*", IEEE Wireless Communications Journal, vol. 12, Issue 2, pp. 66-77, Apr. 2005.
Liew, et al., "*Principles of Broadband Switching and Networking*", Wiley, ISBN: 978-0-471-13901-0, Apr. 2010.
"*Digital Video Broadcasting (DVB); Second generation framing structure, channel coding and modulation systems for Broadcasting, Interactive Services, New Gathering, and other broadband satellite applications (DVB-S2)*", ETSI (European Telecommunications Standards Institute) Standard No. EN 302 307, Version V1.3.1, Mar. 2013.
PCT International Search Report and Written Opinion dated Nov. 15, 2018, for International Patent Application No. PCT/EP2018/062266.
CCSDS 131.2-B-1 Standard "*Flexible Advanced Coding and Modulation Scheme for High Rate Telemetry Applications*".

* cited by examiner

US 11,526,396 B2

MINIMUM-SIZE BELIEF PROPAGATION NETWORK FOR FEC ITERATIVE ENCODERS AND DECODERS AND RELATED ROUTING METHOD

CROSS-REFERENCE TO RELATED APPLICATIONS

This application is a 35 U.S.C. § 371 National Stage filing of International Application No. PCT/EP2018/062266, filed on May 11, 2018, which claims priority to Italian Patent Application 102017000051944, filed on May 12, 2017.

PRIORITY CLAIM

This application claims priority from Italian Patent Application No. 102017000051944 filed on May 12, 2017 the disclosure of which is incorporated by reference.

TECHNICAL FIELD OF THE INVENTION

The present invention concerns Forward Error Correction (FEC) coding and decoding. In particular, the present invention can be advantageously exploited to manufacture high-throughput FEC encoders and decoders for telecommunications, terrestrial and/or of satellite type.

STATE OF THE ART

As is known, FEC techniques are widely used for error detection and correction and, hence, for information protection in data storage/transmission. When used in telecommunications, these techniques allow to markedly reduce transmission power thereby being beneficial to link budget.

Basic FEC codes, often used to construct more complex and higher performance codes, can be divided into two main categories, namely:
- block codes, such as the so-called Low Density Parity Check Codes (LDPCs); and
- convolutional codes, such as the so-called Serially Concatenated Convolutional Codes (SCCCs) and Parallel Concatenated Convolutional Codes (PCCCs).

For a detailed description of the state of the art related to FEC techniques/technologies, in the following reference will be made to:
- C. Berrou, C. Glavieux, P. Thitimajshima, "*Near Shannon Limit error-correcting coding and decoding: Turbo Codes*", IEEE INTERNATIONAL CONFERENCE ON COMMUNICATIONS (ICC) 1993, May 1993, Geneva, Switzerland, pages 1064-1070 (hereinafter referred to as Ref1);
- S. Benedetto, G. Montorsi, D. Divsalar, F. Pollara, "*Soft-Input Soft-Output Modules for the Construction and Distributed Iterative Decoding of Code Networks*", European Transactions on Communications, Vol. 9, No. 2, January 1998 (hereinafter referred to as Ref2);
- S. Dolinar, D. Divsalar, F. Pollara, "*Code Performance as a Function of Block Size*", TMO Progress Report, pages 42-133, May 15, 1998 (hereinafter referred to as Ref3);
- S. Benedetto, G. Montorsi: "*Iterative decoding of serially concatenated convolutional codes*", IET (Institution of Engineering and Technology) Electronic Letters, 20 Jun. 1996, Vol. 32, Issue 13, pages 1186-1188 (hereinafter referred to as Ref4);
- T. Richardson, R. Urbanke, "*The renaissance of Gallager's low-density parity-check codes*", IEEE Communications Magazine, Vol. 41, Issue 8, August 2003, pages 126-131 (hereinafter referred to as Ref5);
- U.S. Pat. No. 6,775,800 B2, that concerns a system and method for high speed processing of turbo codes (hereinafter referred to as Ref6);
- U.S. Pat. No. 6,789,218 B1, that relates to high spread highly randomized generatable interleavers (hereinafter referred to as Ref7);
- S. C. Liew, T. T. Lee: "*Principles of Broadband Switching and Networking*", April 2010, Wiley, ISBN: 978-0-471-13901-0 (hereinafter referred to as Ref8);
- U.S. Pat. No. 4,653,019 A, that concerns a high speed barrel shifter (hereinafter referred to as Ref9);
- CCSDS 131.2-B-1 Standard "Flexible Advanced Coding And Modulation Scheme For High Rate Telemetry Applications" (hereinafter referred to as Ref10);
- S. Benedetto, R. Garello, G. Montorsi, C. Berrou, C. Douillard, D. Giancristofaro, A. Ginesi, L. Giugno, M. Luise, "*MHOMS: High Speed ACM Modem for Satellite Applications*", IEEE Wireless Communications Journal, Vol. 12, Issue 2, pp. 66-77, April 2005 (hereinafter referred to as Ref11); and
- "*Digital Video Broadcasting (DVB); Second generation framing structure, channel coding and modulation systems for Broadcasting, Interactive Services, News Gathering and other broadband satellite applications (DVB-S2)*", ETSI (European Telecommunications Standards Institute) standard No. EN 302 307, version V1.3.1, March 2013 (hereinafter referred to as Ref12).

With reference to Ref1, iterative decoders stem from the revolutionary idea of turbo codes and the related iterative exchange of information (also known as "belief propagation", since it represents, at each iteration, the current knowledge of the data). This information is exchanged iteratively among code component decoders converging progressively towards the exact solution. Iterative decoding gets impressively close to the Shannon performance boundary also for codes with long codewords, task that was impossible before (in this connection, reference can, for example, be made to Ref2 and Ref3). Iterative decoding was subsequently used also for SCCCs (Ref4) and LDPCs (Ref5).

Unfortunately, not all FEC solutions are readily suited for high-speed parallel implementation of the encoder and of the iterative decoder.

In particular, only LDPCs are intrinsically suited for a parallel implementation of the encoder and the iterative decoder. In fact, as described in Ref5, LDPC definition, that can be conveniently described by means of a graph of the code, involves an information exchange among the so-called variable and check nodes, which information exchange is intrinsically parallel.

On the other hand, SCCCs and PCCCs were originally conceived with an intrinsically serial FEC implementation (in this connection, reference can, for example, be made to Ref1 and Ref4), which required an evolution towards a parallel implementation of the decoder that, providing a sufficiently random interleaver, allowed the same memory to be accessed both at input and at output in a parallel fashion (in this connection, reference can, for example, be made to Ref6 and Ref7). These solutions, exploiting an interleaver carefully partitioned to have multiple inputs and multiple outputs over a single codeword size memory, substantially reduce both the memory necessary for parallel implementations and the size of the respective mathematical description. This parallel implementation for the interleaver has made high-speed implementation for encoders and decoders possible. Initial lack of these interleaver solutions for PCCCs and SCCCs was one of the crucial reasons that favored LDPC in the DVB-S2 contest.

At the end of this innovation path, all the above-mentioned FEC solutions can be seen as a so-called "code network", requiring exchange of information (belief) among different points of the code network. A high-speed network is always required to route the processed information back and forth from the code nodes, namely a limited number of processors that are in charge of performing operations on the exchanged information to proceed towards the decoded solution.

The code network and its routing algorithms can be implemented in various modes, not all of which are generally applicable, have simple hardware architecture, or are easily controllable during routing operations.

As previously explained, LDPCs, PCCCs and SCCCs involve, in decoding operations, an exchange of information on the likelihood of the bits to be decoded (belief propagation) among the individual decoder components by means of an interleaver implementable by means of a memory or a routing network, that can be defined as belief propagation network.

In particular, currently known solutions are either memory-based, multiplexer-based or, in the most advanced and fastest implementation, based on Clos networks; such solutions require extensive hardware resources and have no size optimization, since they are not specifically tailored for FEC implementation and no benefits from the specific switching rule are obtained.

In detail, none of the existing solutions specifically addresses minimization of hardware requirements of the belief propagation network and optimization of its dynamical connection control algorithms with respect to the various coding rates to be implemented.

Moreover, it is worth noting that a similar information exchange occurs and, hence, analogous issues arise also at the encoder side (even though with slightly lower criticalities than at decoder side).

More in detail, if one attempts to implement a belief propagation interconnection network of a parallel decoder by means of a general Clos network, complex issues arise both in hardware complexity of the switch fabric and, even more critically, in its routing commands generation, since it is quite complex to determine a routing algorithm.

As is known, a light implementation solution, among generally blocking networks, is based on banyan networks (in this connection, reference can, for example, be made to Ref8); unfortunately, this solution is rigidly based on a power-of-two factorization, thereby not allowing a general factorization.

Also the solutions based on barrel shifters (in this connection, reference can, for example, be made to Ref9), that represent a very efficient network typology used in Arithmetic Logic Units (ALUs) of computers, are based on a power-of-two factorization and generate logarithmic complexity structures, thereby resulting in said barrel-shifter-based solutions not being generally applicable.

In particular, existing solutions based on banyan networks and barrel shifters, since they are not endowed with general flexibility in the number of inputs, may incur critical blocks and may allow not to achieve a desired interleaver law, as it will be described hereinafter.

In the following, some examples of existing solutions will be described in detail along with the respective technical drawbacks.

Current LDPC, SCCC and PCCC schemes have modulo-based, shift register pattern rules for the belief propagation network contained in the encoder and the decoder.

As far as DVB-S2 standard is concerned (in this connection, reference can be made to Ref12), in early 2000s LDPCs, SCCCs and PCCCs were evaluated, on the basis of flexibility, performance and hardware complexity criteria, in order to select the most promising modulation and coding solution to be adopted for DVB-S2. At last, the LDPC solution was chosen by virtue of its intrinsically parallel architecture. Anyway, soon afterwards, also SCCC and PCCC solutions (initially penalized by the need for interleaver memory replication in high speed parallel implementations) were improved so as to manage to use a compact parallel interleaver, thereby achieving the same, and in some respects even better, performance than LDPCs.

All the above codes rely on predefined "modulo reduction" mathematical operations to describe the internal coding rules. DVB-S2 LDPCs, in order to limit the complexity of description of the big amount of parallel interconnections of the encoder and the decoder, are mathematically defined using a formula for the description of the interconnections which is based on a modulo-360 reduction, that can be physically implemented, as an example, by a First In First Out (FIFO) methodology and by means of a bank of parallel shift registers to manage the information flow.

Also the latest parallel implementations of SCCCs and PCCCs are based on modulo reduction rules that, slightly limiting the randomness of the interleavers, allow their parallel implementation since the interleavers' memory can be partitioned in banks and then sent to a shift register (or interconnection network) to provide parallel data transfer.

The first idea for parallel implementation of coders and decoders was the above one based on FIFO and shift registers, that provides a good speed improvement via multiple Soft Input Soft Output (SISO) processors.

In view of what has been previously explained, the interleaver represents a very important part of the LDPC/SCCC/PCCC-based codecs, wherein said interleaver typically includes a memory and a belief propagation network.

In a classical SCCC encoder, such as the ones described in Ref4 and Ref11, an outer encoder writes the output in one memory in natural order, while an inner encoder reads the data in the order imposed by the interleaving law, or permutation, expressed as $$\text{Perm}(i) = \{0,1,2,I-1\}, \quad (1)$$

where I denotes the size of the interleaver (I being also the number of bits in a codeword). The memory between the outer and the inner encoders, in the original code definition, is composed of one single block, has a size equal to the maximum size of the interleaver and is written and read one bit at a time, at the encoder side.

In order to make a parallel implementation possible for both the encoder and the decoder, the interleaving has to be designed so that the overall permutation law can be divided into sub-block laws. The goal is to define a number of sub-blocks of the original memory; the possible permutations shall be somehow bound to selectively route the information to respective single sub-blocks; in other words, the overall interleaver must result as composed by $\tau$ independent interleavers, so that a belief propagation network will have the possibility to be parallel.

With such a conceived structure, at the decoder, a specific bit log-likelihood ratio (a logarithmic quantity expressing the belief that a bit is 1 or 0) is known to be stored in one of the independent memory sections; hence, to one input or output of the interconnection network connecting the SISO processors (in this connection, reference can be made to Ref2) with the memory is never requested to cross the block boundary and reach other sections.

The interleaving laws allowing this are described exhaustively by two parameters $\rho(i)$ and $\pi(i)$, with $i=0, \ldots, W-1$ where the following relation applies:

$$W = \frac{I}{\tau}. \quad (2)$$

The parameter W denotes the size of the memory sub-block and is equal to the ratio between the size of the overall memory I and the parallelism degree $\tau$. Actually, only the first W permutations are defined by $\rho(i)$ and $\pi(i)$, while the other I-W permutations, with $$(\tau-1)*W=I-W, \quad (3)$$

can be obtained by the first W permutations, since they follow a similar rule. In order to simplify the interleaving operations, a number k is defined such that $0 \le k \le \tau-1$ (wherein, as previously explained, $\tau$ denotes the number of independent functional interleavers and, hence, of parallel codecs). Then, the interleaving permutation is equal to:

$$\text{Perm}(i,k)=\pi(i)+[(\rho(i)+k)\text{MOD } \tau]*W, \quad (4)$$

with $i=0, \ldots, W-1$ and $k=0, \ldots, \tau-1$.

Thence, for each parallel codec k, the permutation for the first bit information location is obtained. For instance, upon supposing a permutation of size I=10440 and assuming that 120 parallel codecs are necessary to reach the required throughput, the permutation laws can be split in 120 sub-blocks, so that the interleaver can be specified only by W=10440/120=87 pairs of numbers p(i) and z(i).

Each sub-block corresponds in the hardware implementation to a separate memory bank. The first number, indicated with $\pi$, is the law of permutation within the memory bank of size W and constitutes the address; the second number, indicated with $\rho$, can be interpreted as the memory bank to which the codec 0 has to be routed, or vice versa, and indicates the configuration of the interconnection network. The interleaving law according to Ref10 and Ref11 is based on cyclic shifts so that the same value $\rho$ defines the connections for all the codecs processors. The output of the code is routed in the memory bank in a decoding phase. Instead, the information read from the memory bank is routed to the codec in the other decoding phase.

As a matter of fact, if the processor 0 is connected to the bank $\rho$, then the second processor will be connected to the bank $[(\rho+1)\text{mod }120]$, the third processor will be connected to the bank $[(\rho+2)\text{mod }120]$ and so on up to the processor 119, since in the initial design the processors (codecs) were 120.

The simplest implementation of the interleaver is based on 120 multiplexers 120:1, i.e. with 120 inputs and only one output. In general, the first input to the multiplexer i comes from the memory bank 0, the second input to the multiplexer i comes from the memory bank 1, the input 119 is physically connected with the memory bank 119.

In the following Table 1 the initial values of $\rho$ and $\pi$ are shown for an interleaving size equal to 10440 for the SCCC solution described in Ref10 and Ref11.

TABLE 1

| $\pi$ | $\rho$ |
|---|---|
| 15 | 30 |
| 39 | 53 |
| 16 | 12 |
| 22 | 101 |
| 17 | 7 |
| 21 | 78 |
| 66 | 51 |
| 41 | 20 |
| 86 | 34 |
| 56 | 114 |
| ... | ... |

On the basis of the previous Table 1, the interleaving operation can be carried out only in W clock cycles: at the first clock cycle, the data in position 15 are read in all the memory banks with the multiplexers that use the configuration 30. Configuration 30 means that the processor 0 is connected to bank 30, the processor 1 to bank 31, the processor 2 to bank 32 and so on up to processor 119.

In more general terms, the i-th processor is connected to the bank $(\rho+i)$ mod $\tau$, where mod denotes the modulo operation producing an integer remainder by dividing $(\rho+i)$ by $\tau$ (reminding that $\tau$ represents the parallelism degree, i.e., the number of independent interleavers/parallel codecs used).

At the second clock cycle, the data in position 39 are read in each memory bank and the multiplexers use the configuration 53. Configuration 53 means that the first multiplexer is connected to bank 53, the second multiplexer to bank 54, the i-th multiplexer to bank $(53+i)$mod 120, and so on up to clock cycle 87 (in the general case W clock cycles are necessary).

The previous approach, however, has the following technical drawbacks:
   the number of memory banks to be used is equal to $\tau$ although the number of processors which can be implemented in a single Field-Programmable Gate Array (FPGA) device could be lower than $\tau$; this is particularly true at the decoder side, where the computation complexity requires demanding hardware resources;
   the time-varying $\tau$-way multiplexers (in a brute-force network implementation) can require rather demanding hardware for current FPGA and Application-Specific Integrated Circuit (ASIC) technology.

For the previous reasons, a number of alternative solutions have been investigated in recent years, starting from Clos multistage interconnection networks.

Considering the above mentioned example, a simplification can be achieved by implementing the physical connections among memory blocks and SISO processors by means of a particular multistage interconnection network rather than $\tau$ different $\tau$-way multiplexers or equivalent Clos networks.

A multistage network consists of more than one stage of switching elements and is usually capable of connecting an arbitrary input to an arbitrary output (in this connection, reference can, for example, be made to Ref8). Multistage networks are classified into blocking or non-blocking networks. In blocking networks, simultaneous connections may result in a conflict in the use of network communication links. A network which can handle all possible permutations without rearranging connections is a non-blocking network (in this connection, reference can be made again to Ref8).

A particular interconnection network is the so-called Benes network, that is a special non-blocking network based on binary switching elements, which can be set by a control line into a direct-connection state or a crossed-connection state, thus allowing all of the possible permutations from two inputs to two outputs. An example of binary switching element usable in a Benes network is shown in FIG. 1, where the two input-output configurations (i.e., direct-connection and crossed-connection states) of the binary switching element depending on control line value are schematically illustrated.

As is known, a Benes network of size n is built recursively from binary switching elements. In general, a Benes network of size n, with n power of two, is constituted by $N_{stg}$ switching stages, with $N_{stg}$ defined as:

$$N_{stg}=2*\log_2(n)-1, \tag{5}$$

and requires n/2 switches per stage (2 inputs per switch).

In this connection, FIG. 2 shows a Benes network of size n=4 built using six basic switching elements SW1, SW2, SW3, SW4, SW5, SW6 (as the one illustrated in FIG. 1) organized in $N_{stg}$=3 switching stages ST1, ST2, ST3 (each stage including two switching elements).

An interconnection network realized by means of a Benes network allows to considerably simplify complexity of routing from memory to the processors and vice versa; as a matter of fact, the complexity of a 32×32 full Benes interconnection network is currently quantifiable in 288 FPGA Logic Elements (LEs) per bit, four times lower than multiplexer implementation.

Logic Elements (LEs) are customarily a reasonable way to generally define the smallest logic units in a FPGA architecture. Considering features of existing FPGA devices, here the LEs are assumed to implement the following hardware functions:
  a four-input Look-Up Table (LUT), which can implement any function of four variables;
  a programmable register;
  a carry chain connection;
  a register chain connection.

In the following, the number of required LEs will be used as a measure of the complexity of the various interconnection network solutions, including the present invention. This will allow quite reliable comparisons.

As previously described, there is a wealth of literature on FEC techniques/technologies, but all known solutions suffer from respective technical drawbacks.

For example, Ref6 and Ref7 describe interleaving rules for parallel implementation but do not provide any hint for minimizing the interconnection networks or the associated control rules.

Ref8 discloses power-of-two banyan networks with non-blocking properties, but such networks are not generally factorizable and a routing rule matching the specific interleaver properties is not presented.

Another solution often used to perform cycling shifting is a classical barrel shifter (in this connection, reference can, for example, be made to Ref9). As is known, the barrel shifter is a digital circuit that can shift a data word by a specified number of bits without the use of any sequential logic, i.e., only by using a pure combinatorial logic. A barrel shifter may be implemented by means of a sequence of multiplexers where the output of one multiplexer is connected to the input of the next multiplexer in a way depending on the shift distance. A barrel shifter is often used to shift and rotate n-bits in modern microprocessors, typically within a single clock cycle. A barrel shifter is often implemented as a cascade of parallel 2×1 multiplexers. Unfortunately, also barrel shifters are based on power-of-two factorization that leads to logarithmic switching structures.

The number of multiplexers required in a barrel shifter for an n-bit word is n $\log_2$n, thereby resulting in:
  896 multiplexers being necessary for a word size of 128 bits;
  384 multiplexers being necessary for a word size of 64 bits;
  160 multiplexers being necessary for a word size of 32 bits;
  64 multiplexers being necessary for a word size of 16 bits; and
  24 multiplexers being necessary for a word size of 8 bits.

The barrel shifter architecture is very efficient in terms of hardware requirements. However, barrel shifters have, unfortunately, also an evident drawback, namely they have the numbers of input and output terminals equal to a power of 2, as the Benes network. This limitation becomes quite clear with the subsequent example: in order to implement 28 cyclic shifts on a 30-bit word, an interconnection network based on barrel shifter architecture shall have a 32×32 size. In fact, the addition of two inputs is necessary to render the size of the network a power of two, but it implies that the updated routing does not correspond to a cyclic shift but becomes a generic interconnection, which is more difficult to be achieved since the associated routing algorithm is more complex.

Thence, as previously explained, barrel shifters are strictly based on power-of-2-size architecture; this is not a drawback in the typical application of these networks (computation in microprocessors) because the expansion of the word size doesn't alter the computation, although it requires some useless hardware resources. Instead, in FEC applications it is not possible to implement a τ-based shift with an interconnection network of a higher size than τ (with a generic τ that is not a power of 2, for example r=30).

Another classical interconnection network used to interconnect a generic number of inputs, is the Clos network (in this connection, reference can, for example, be made to Ref8). Clos networks constitute the basic seminal solution for multistage circuit switching networks. Clos networks are required when the physical circuit switching needs to exceed the capacity of the largest feasible single crossbar switch, to partition the most general switch into smaller switching stages. The key advantage of Clos networks is that the number of required cross-points (which compose each crossbar switch) can be much smaller than if the entire switching system were implemented by means of one large crossbar switch.

As shown in FIG. 3, Clos networks typically include three stages: an "ingress" stage S1, a "middle" stage S2, and an "egress" stage S3. Each stage is made up of a number of crossbar switches. Each input of the ingress stage S1 can be routed through any of the available crossbar switches of the middle stage S2 to the relevant crossbar switch of the egress stage S3. A crossbar switch of the middle stage S2 is available for a particular new input to be routed if both the link connecting the relevant crossbar switch of the ingress stage S1 to said crossbar switch of the middle stage S2, and the link connecting said crossbar switch of the middle stage S2 to the relevant switch of the egress stage S3, are free.

In general, Clos networks are defined by three integers n, m, and r, where n represents the number of sources which feed into each of r crossbar switches of the ingress stage S1. In particular, the ingress stage S1 includes r crossbar switches, each with n inputs and m outputs. The middle stage S2 includes m crossbar switches, each with r inputs and r outputs. There is exactly one connection between each switch of the ingress stage S1 and each switch of the middle stage S2. Moreover, the egress stage includes r crossbar switches, each with m inputs and n outputs. There is exactly one connection between each switch of the middle stage S2 and each switch of the egress stage S3.

Clos networks are able to perform any interconnection among the inputs and the outputs. However, this approach has the same drawbacks as the Benes networks.

In particular, the major drawback is the complexity of the routing algorithm. As for the Benes networks, the processing time required to compute the routing parameters is not compatible with the data rates required in applications such as telecommunications and earth observation.

Additionally, a Clos network of size n allows all the n! possible connections while, if only $\tau$ (for example $\tau$=30) different connections are necessary, there can be a high waste of resources.

Finally, in order to guarantee all the n! possible connections, the Clos networks require demanding hardware resources.

A known example of flexible channel decoder is disclosed in US 2013/156133 A1, which relates to a configurable Turbo-LDPC decoder comprising: a set of P>1 SISO decoding units for iteratively decoding both Turbo- and LDPC-encoded input data, each of said decoding units having first and second input ports and first and second output ports for intermediate data; first and second memories for storing said intermediate data, each of said first and second memories comprising P independently readable and writable memory blocks having respective input and output ports; and a configurable switching network for connecting the first input and output ports of said decoding units to the output and input ports of said first memory, and the second input and output ports of said decoding units to the output and input ports of said second memory. However, US 2013/156133 A1 mostly focuses on enhancing flexibility of known turbo decoding principles, while it does not address generalized interconnection networks with a generic number of ports, it does not tackle minimization of network size, nor efficient switch fabric command algorithms. All these issues represent a crucial asset for hardware-efficient, high-speed and fast-configurable encoders and decoders.

OBJECT AND SUMMARY OF THE INVENTION

The above-mentioned interconnection networks may be efficient in terms of hardware requirements, but have some technical drawbacks.

In particular, the major drawback of the Benes and Clos networks is the complexity of the routing algorithm, which is necessary to route the data through the network. Often, the processing time required to compute the routing parameters is not compatible with the data rates required in applications such as telecommunications and earth observation.

In detail, if one attempts to implement a belief propagation interconnection network of a parallel decoder by means of a general Clos network, complex issues arise, both in hardware complexity of the switch fabric and, even more critically, in routing commands generation, since it is quite complex to determine a routing algorithm.

As for Benes topology, some non-blocking networks and also other types of networks (e.g., banyan networks and barrel shifters), the number of input and output terminals must be a power of 2. If the size of the needed network is not a power of 2, a network with larger size than needed is to be used and many resources in the used network will remain idle.

Moreover, Benes and Clos networks of size n allow all the n! possible connections while, if only $\tau$ (for example $\tau$=30) different connections are necessary, there can be a high waste of resources.

Finally, a 32×32 full Benes interconnection network requires $[2 \log_2(32)-1]*(32/2)=144$ time-varying control lines to configure the switching elements. Therefore, the resulting configuration is very complex.

Thence, an object of the present invention is that of alleviating, at least in part, the aforesaid drawbacks of the current interconnection networks, such as Clos networks, Benes networks, banyan networks and barrel shifters.

Moreover, another object of the present invention is that of providing a very efficient and controllable network for belief propagation in iterative FEC decoders of any type (such as LDPC-based, PCCC-based or SCCC-based) with real-time self-routing capabilities.

These and other objects are achieved by the present invention in that it relates to an interconnection network for forward error correction encoders and decoders, as defined in the appended claims.

In particular, the interconnection network according to the present invention includes N input terminals, N output terminals, and M stages; wherein N is a non-prime positive integer, and wherein M is a positive integer equal to, or higher than, two.

The M stages include a first stage and a last stage, and each stage includes switching elements having, each, respective input pins and respective output pins.

The input pins of the switching elements of the first stage are connected to the input terminals, and the output pins of the switching elements of the last stage are connected to the output terminals.

The input and output pins of the switching elements of immediately successive stages are connected in a hardwired fashion so as to form interconnection sub-networks for routing, each, respective input values from respective output pins of the switching elements of the first stage to respective input pins of the switching elements of the last stage.

Whereby, the interconnection network is operable to route, on the basis of routing commands applied to the switching elements, N input values received at the N input terminals through the M stages and the interconnection sub-networks to provide, at the N output terminals, N output values corresponding to, or circularly shifted with respect to, said N input values received at the N input terminals.

The interconnection network is characterized in that M denotes a number of given submultiples of N whose product is equal to N.

Moreover, each stage is associated with a respective submultiple of said M given submultiples of N, and includes $S_i$ switching elements, each having $sm_i$ respective input pins and $sm_i$ respective output pins, wherein $S_i=N/sm_i$, wherein $sm_i$ denotes said respective submultiple associated with said stage, and wherein i denotes said stage and is a positive integer comprised between one and M.

Additionally, each switching element is configured to:
receive, at the $sm_i$ respective input pins, $sm_i$ respective input values; and
provide at the $sm_i$ respective output pins, on the basis of a respective routing command applied to said switching element, $sm_i$ respective output values corresponding to, or circularly shifted with respect to, said $sm_i$ respective input values received at the $sm_i$ respective input pins.

Finally, the interconnection network includes $sm_1$ interconnection sub-networks for routing, each, $N/sm_1$ respective input values from $N/sm_1$ respective output pins of the switching elements of the first stage to $N/sm_1$ respective input pins of the switching elements of the last stage, wherein said $sm_i$ interconnection sub-networks are not connected to each other, and wherein $sm_i$ denotes the submultiple, among said M given submultiples of N, which is associated with the first stage.

BRIEF DESCRIPTION OF THE DRAWINGS

For a better understanding of the present invention, preferred embodiments, which are intended purely by way of non-limiting examples, will now be described with reference to the attached drawings (all not to scale), wherein.

DETAILED DESCRIPTION OF PREFERRED EMBODIMENTS OF THE INVENTION

Figure 1:
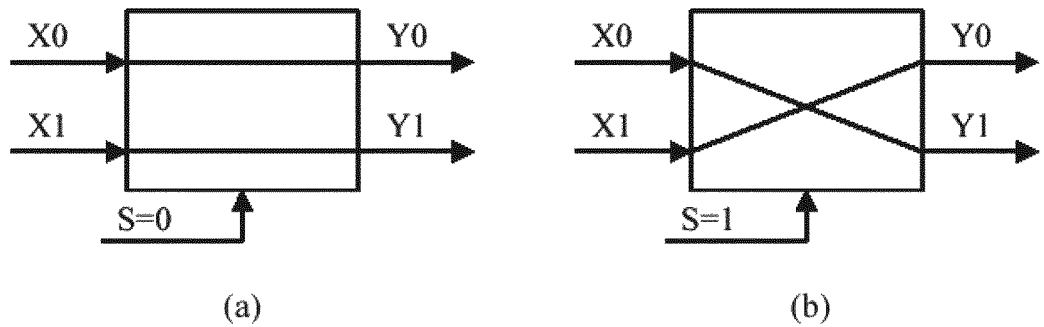
FIGS. 1 and 2 schematically illustrate, respectively, a binary switching element in direct-connection and crossed-connection states and a three-stage Benes network employing six of said binary switching elements.
Figure 2:
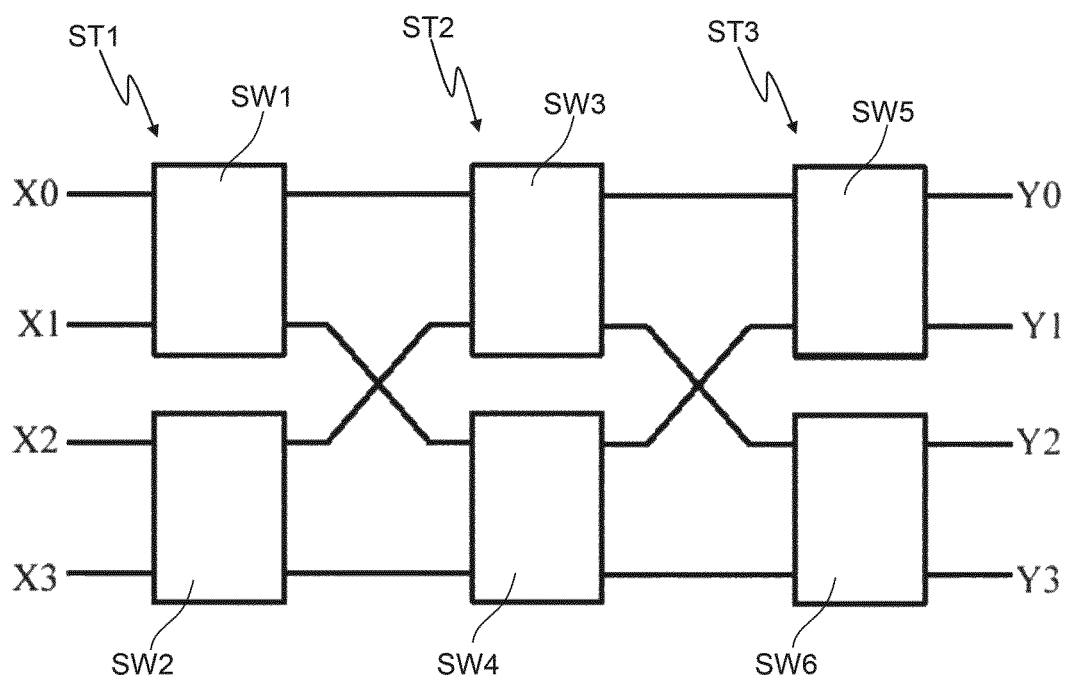
Figure 3:
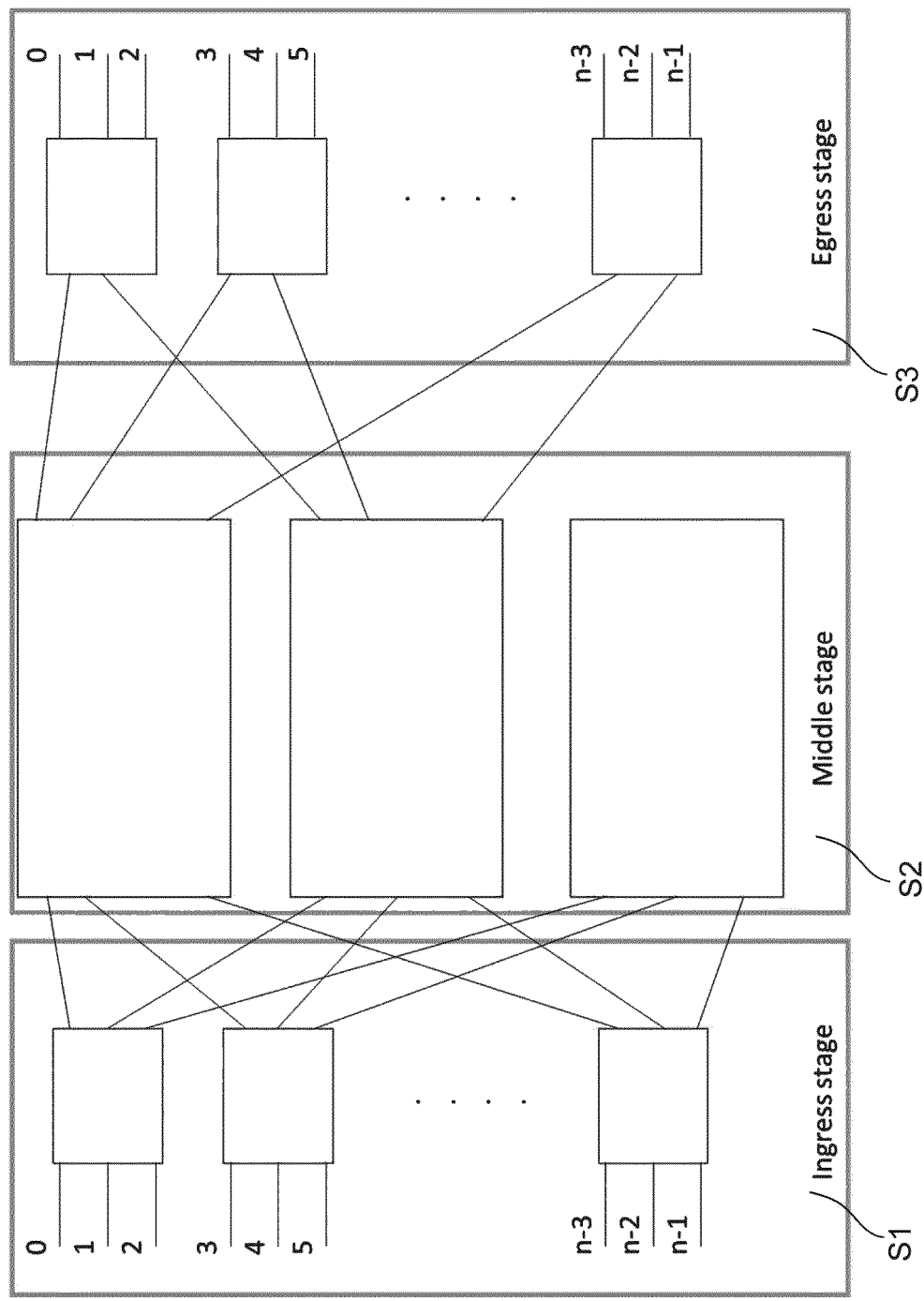
FIG. 3 schematically illustrates a typical three-stage Clos network architecture.

The following discussion is presented to enable a person skilled in the art to make and use the invention. Various modifications to the embodiments will be readily apparent to those skilled in the art, without departing from the scope of the present invention as claimed. Thence, the present invention is not intended to be limited to the embodiments shown and described, but is to be accorded the widest scope consistent with the principles and features disclosed herein and defined in the appended claims.

The present invention relates to an interconnection network that can be advantageously exploited in all iterative FEC decoders and coders, in particular those based on SCCCs, PCCCs and LDPCs.

In particular, the present invention allows to make very efficient, easily routable and controllable belief propagation networks for any iterative FEC decoder (i.e., LDPC-based, PCCC-based or SCCC-based) by exploiting regular interleaver algorithm properties so that some switching elements of a general Clos network and, in addition, also the most critical parts of the routing algorithms of the Clos networks (specifically, the routing algorithms of the first stage of a Clos network) can be removed. Analogous networks, of reduced data path size, may be advantageously exploited also for FEC encoders.

The interconnection network according to the present invention has general factorization properties, requiring only that the number of inputs (i.e., the parallelism degree) be a non-prime number, and allows to achieve high throughput of encoders and decoders, by enabling parallel processing architecture while maintaining the required memory fixed.

Hereinafter two examples of application of the interconnection network according to the present invention will be described in detail, one related to SCCCs and the other one to LDPCs. In this connection, it is worth noting that, in view of the example of application of the present invention to the SCCC technology described in detail in the following, also the application of the interconnection network according to the present invention to the PCCC technology will be immediately clear, mutatis mutandis, for those skilled in the art.

As is known, with concatenated convolutional codes (SCCCs and PCCCs), decoding operations are performed by means of two (or even more than two, for PCCCs) distinct entities, which decode the data separately from one another; in particular, the two entities operate on, and exchange, extrinsic information containing soft information indicative of the belief on decoded bits (specifically, the belief that a decoded bit is 1 or 0).

The data to be decoded (or coded), due to the above-explained parallel interleaver properties, are organized into totally separate sub-blocks, with no overlapping among the various blocks. In other words, the extrinsic information memory (i.e., the memory for storing the extrinsic information) can be partitioned into a number of sub-blocks equal to the parallelism degree; the codes have to be designed so as to allow for computational parallelism and minimized hardware requirements. The memory partition is different in each processing phase of the codec; the challenge of a high throughput codec architecture is to guarantee an efficient parallel implementation in both the phases. To be more clear, processing phases are the inner and outer processing phases of SCCC, or the natural or permuted order processing phases in a two-basic-codes PCCC. As a matter of fact, some examples are introduced to better highlight that the accessed sub-blocks are different in each decoding phase, e.g., in inner and outer decoding of the SCCCs.

Figure 4:
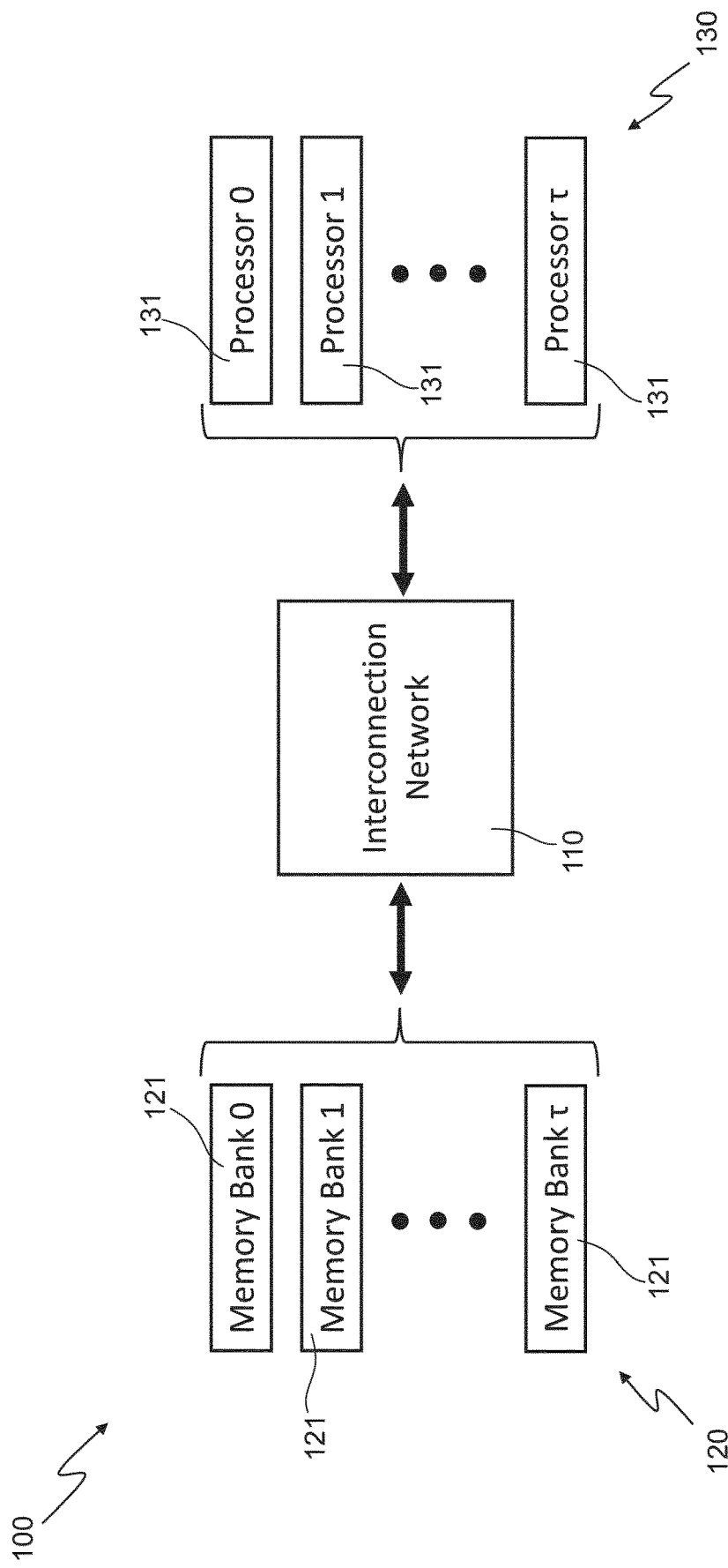
FIGS. 4 and 5 schematically illustrate an SCCC decoder provided with an interconnection network according to a preferred embodiment of the present invention.

In this connection, FIG. 4 shows a simplified block diagram representing a functional architecture of an SCCC decoder (denoted as a whole by 100), that includes:
- an interconnection network 110 according to a preferred embodiment of the present invention, wherein said interconnection network 110 is able to carry out data exchange between inner and outer codes in real-time, by avoiding any conflict in memory access;
- a memory 120 for storing extrinsic information data, wherein said memory 120 is organized in τ different separate memory banks 121; and
- a set of Soft Input Soft Output (SISO) processors 130 including τ parallel processors 131 operable to perform decoding.

In order to allow parallel implementation of the SCCC decoder 100, the design of the interleaver guarantees that the memory banks 121 do not overlap with each other during the two phases.

In one of the two phases (i.e., inner and outer), the reading from the memory banks 121 is sequential and the sub-blocks are easily identified in FIG. 4, while in the other phase the subdivision into sub-blocks is functional (and hence it is not evident in FIG. 4).

The interconnection network 110 allows to route the data in an instantaneous, efficient manner, without any computation constraint thanks to the implementation of a new, innovative self-routing algorithm according to an aspect of the present invention.

The same structure can be reused for any degree of parallelism and for any code whose coding/decoding process can be split into two stages as in FIG. 4. Said architecture can be used for the PCCC or SCCC codecs and also for the LDPC defined in the DVB-S2 standard.

Figure 5:
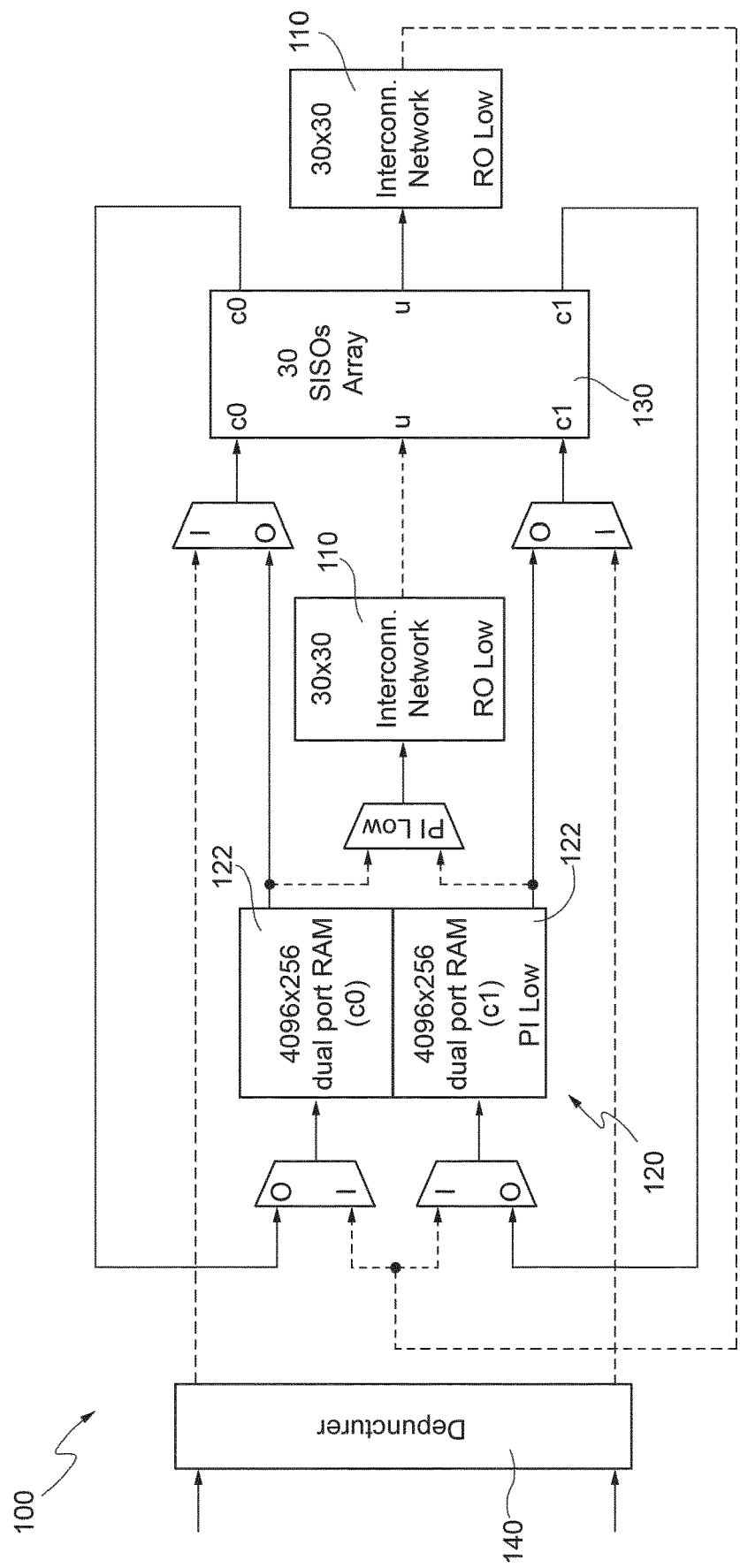

FIG. 5 shows in greater detail the functional architecture of the SCCC decoder 100, wherein:
- a depuncturer 140 (hereinafter referred to as depuncturing unit too) is also shown;
- the memory 120 is implemented by means of two 4096× 256 dual port Random-Access Memories (RAMs) 122; and
- τ=30 and, hence, the interconnection network 110 is a 30×30 interconnection network (i.e., it has thirty inputs and thirty outputs).

In particular, the SCCC decoder 100 is a binary decoder that works on input quantities which are log-likelihood ratios (LLRs) of the bits encoded by the corresponding binary encoder at the transmitter side.

During the inner phase, the parallel SISO processors 130 use the LLRs written into the memory 120 along with the extrinsic information to update said extrinsic information.

The interconnection network 110 realizes the interleaving (in reading) and the de-interleaving (in writing) and is used to scramble the extrinsic information from the outer to the inner phase.

The depuncturing unit 140 is necessary to re-insert the bits punctured at the transmitter side (a punctured bit corresponds to a neutral LLR value equal to zero). The LLRs are routed towards the SISO processors 130 through the depuncturing unit 140 only during the inner phase; the interconnection network 110 is also used only during the inner phase to route towards the SISO processors 130 the extrinsic information (u) containing soft information which is part of the belief on decoded bits from the memory 120 and vice versa.

In the outer phase, instead, the memory 120 is read in the natural order.

The aforesaid operation represents the classic implementation of a SCCC decoder.

Before describing in greater detail the interconnection network 110, it is worth explaining also the logical path that has led the Applicant to conceive the interconnection network according to the present invention.

An initial goal of the Applicant was that of designing a hardware architecture with the most suitable parallelism with respect to SCCC, PCCC or LDPC requirements. Hereinafter, for the sake of description simplicity, reference will be made again to the SCCC application.

Figure 6:
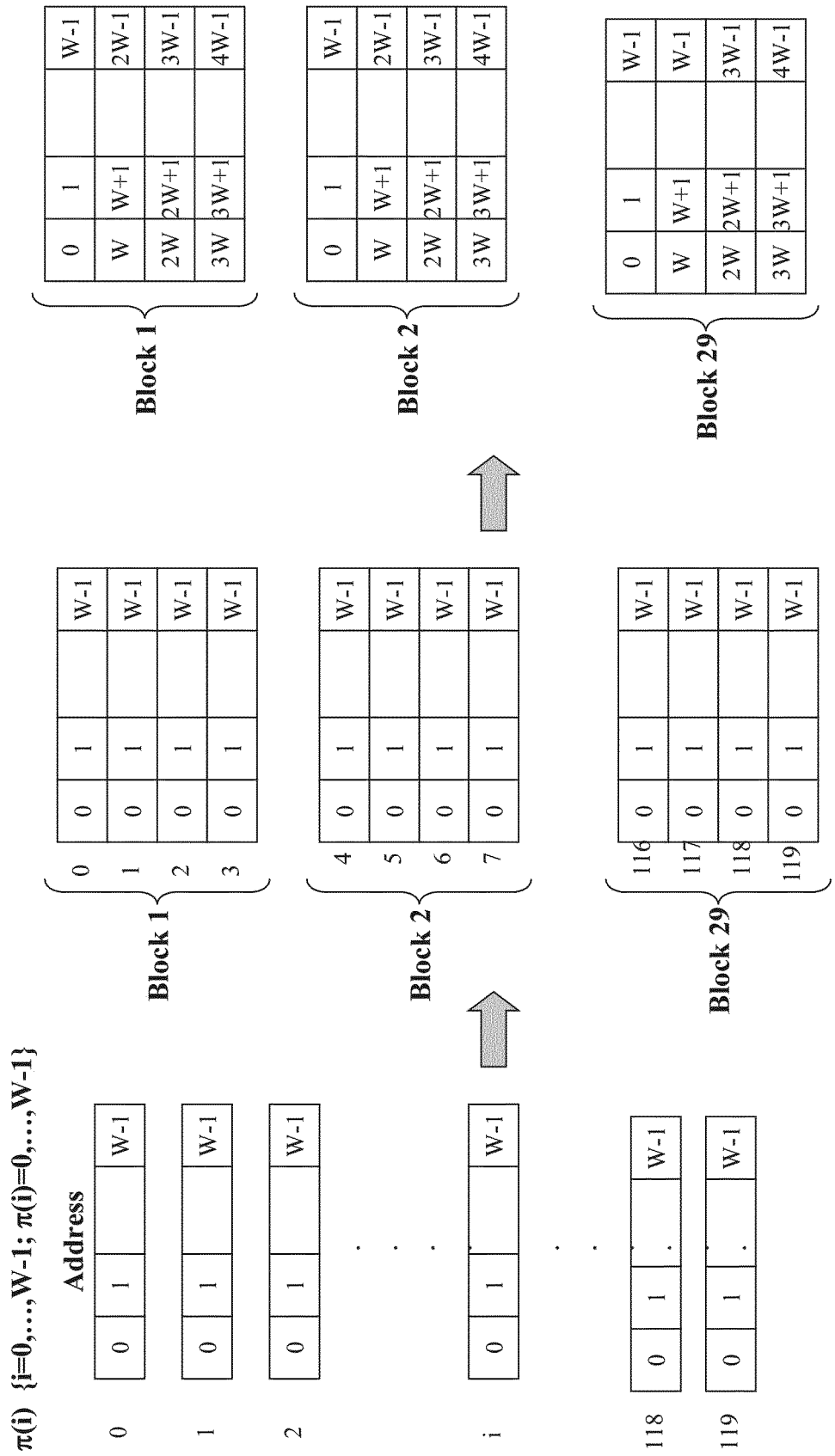
FIG. 6 schematically illustrates an example of rearrangement of a memory intended to store extrinsic information and log-likelihood ratio data.

In order to make possible a generic parallelism degree to be chosen as an optimum trade-off between technology constraint and required throughput, the Applicant has designed a simplified architecture where the hardware parallelism degree can be any sub-multiple of the original interleaving parallelism, so that a scalable interleaving structure is obtained, that considerably simplifies the interleaving complexity for any degree of parallelism (which can be decided also on the basis of the target technology). The challenge is to guarantee that there is no collision in any of the memory banks, even scaling down the original design implying τ sub-blocks, whereas one may desire to be able to implement also a parallelism degree φ lower than τ. For example, let us assume that only 30 processors are implemented, whereas the designed (original) parallelism is 120; theoretically, at every clock rising edge, access to only 30 separate memory banks is necessary, wherein each memory bank is selected and accesses by only one processor at a time. In this case, it is possible to define and use 30 new memory blocks, each constituted by 4 old memory banks (since original parallelism is 120), as schematically illustrated in FIG. 6 (where an example of rearrangement of an extrinsic information and log-likelihood ratio data memory is shown). In this way, each of the 30 processors carries out in sequence the tasks of 4 of the 120 original processors in a four times longer processing time. The first processor carries out the tasks of the processors 0, 1, 2, 3, the second one carries out the tasks of the processors 4, 5, 6, 7, and so on up to thirstiest processor; hereinafter the 4 aforementioned tasks of every processor will be called encoding/decoding phases 0, 1, 2, 3. At every clock rising edge, two different processors cannot access simultaneously to one memory bank, thanks to the interleaving laws so that there is no conflict among processors; as a matter of fact, the original design of the interleaver is able to guarantee this no-conflict condition. In addition, this solution simplifies the routing issue, since it reduces the required fan-in of the employed multiplexers from 120:30 to 30:30, thereby considerably reducing the high fan-out of memory banks and the complexity of the multiplexers (in fact, this design requires that only a 30-way MUX per SISO be implemented). In a general approach, φ memory banks and φ multiplexers φ:1 are used, thereby guaranteeing a high flexibility (scalability) and allowing to implement the codecs in a number of different technologies, on the basis of the requirements.

Due to the rearrangement and redefinition of the memory banks and the reduction of parallelism from τ to φ (for example, from 120 to 30), the π and ρ parameters must be modified in accordance with the following laws:

$$\pi_{new} = \pi_{old} + [(\rho_{old} + m) \bmod n]*W, \tag{6}$$

$$\rho_{new} = [(\rho_{old} + m) \bmod \tau] \operatorname{div} n, \tag{7}$$

where div denotes the Euclidean division operation producing an integer quotient by dividing $[(\rho_{old}+m) \bmod \tau]$ by n, mod denotes the modulo operation producing an integer remainder by dividing $(\rho_{old}+m)$ by, respectively, n and τ, m denotes the decoding phase (0, 1, 2, 3), W denotes the size of the memory sub-block and is equal to the ratio between the size of the overall memory I and the parallelism degree τ, and n denotes the ratio between the original parallelism (i.e., τ) and the new one (i.e., φ), namely n=τ/φ.

It is worth noting that hereinafter the notations div and mod will be used with the same meaning as the one just explained (i.e., to denote, respectively, the Euclidean division operation producing an integer quotient, and the modulo operation producing an integer remainder) and, hence, they will not be described again.

By applying the equations (6) and (7) to above-described example (wherein τ=120 and φ=30), there results that:

$$\pi_{new} = \pi_{old} + [(\tau_{old} + m) \bmod 4]*W,$$

$$\tau_{new} = [(\tau_{old} + m) \bmod 120] \operatorname{div} 4.$$

Thence, two additional bits are required to represent the address π; in particular, two bits are introduced at the beginning of the address to distinguish the four original memory banks composing the new memory banks. The new interleaving command parameters should be computed in run-time, since the memory necessary to store them is remarkable (four times greater than the previous one). The computation is easy and doesn't requires considerable hardware resources.

Getting back to the description of the interconnection network 110 according to the preferred embodiment of the present invention, it is worth noting that said interconnection network 110 is a simplified interconnection network designed to operate as a sort of cyclic shift register of size τ (conveniently, with τ=30) and to carry out a cyclic shift of a generic number of positions ρ at a single clock cycle. It is important to stress the point that the size τ can be generalized to any generic size N, provided that N is a non-prime positive integer.

The interconnection network 110, differently from Benes networks, doesn't use a single type of switching elements, but is based on switching elements which have different size and output the input value appropriately shifted.

Figure 7:
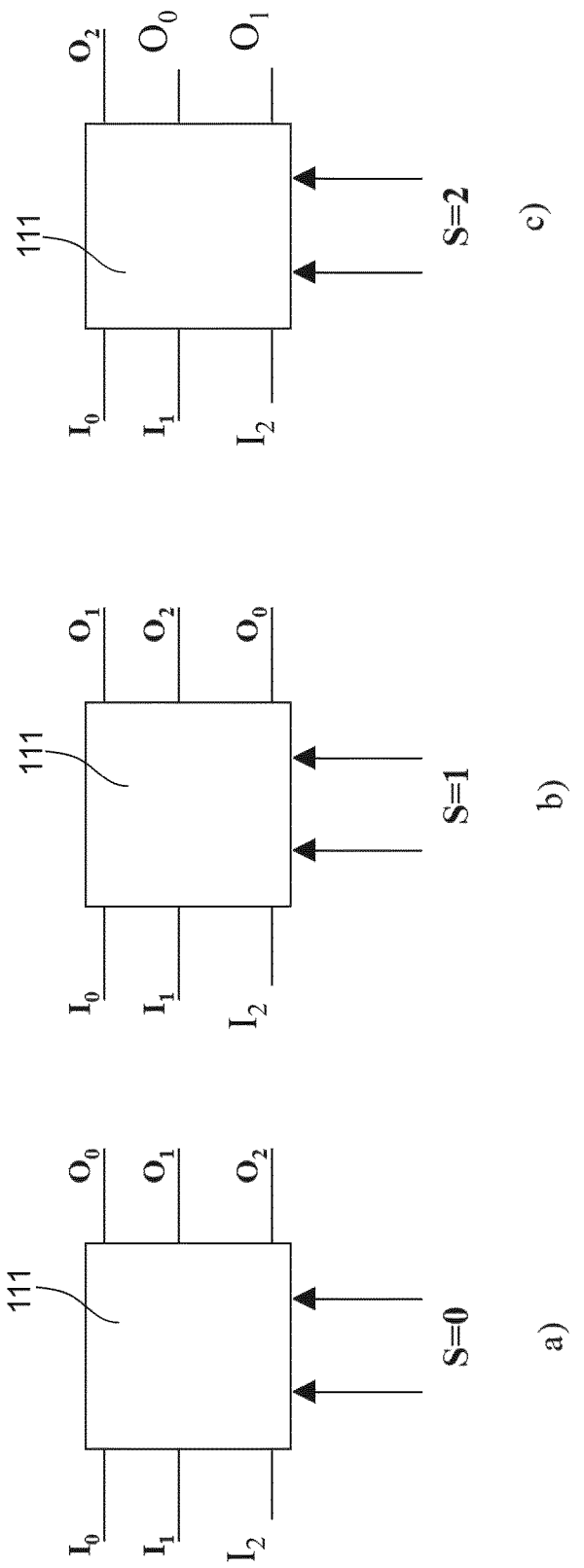
FIG. 7 schematically illustrates a 3×3 switching element used in the interconnection network according to said preferred embodiment of the present invention.

In this connection, FIG. 7 schematically illustrates an example of 3×3 switching element (denoted by 111) that can be used in the interconnection network 110. In particular, said switching element 111 can be set by two control line bits into three connection states, wherein:

in a first connection state (denoted by a) in FIG. 7), the switching element 111 outputs,
  at a first output, a bit $O_0=I_0$ received at a first input,
  at a second output, a bit $O_1=I_1$ received at a second input, and
  at a third output, a bit $O_2=I_2$ received at a third input;
in a second connection state (denoted by b) in FIG. 7), the switching element 111 outputs
  at the first output, a bit $O_1=I_1$ received at the second input,
  at the second output, a bit $O_2=I_2$ received at the third input, and
  at the third output, a bit $O_0=I_0$ received at the first input; and
in a third connection state (denoted by c) in FIG. 7), the switching element 111 outputs
  at the first output, a bit $O_2=I_2$ received at the third input,
  at the second output, a bit $O_0=I_0$ received at the first input, and
  at the third output, a bit $O_1=I_1$ received at the second input.

The size of the switching elements used in the interconnection network 110 depends on the factorization of the size τ=N=30 of said cyclic-shift-register-like interconnection network 110 into prime numbers (or primes). For example, since the factorization of τ=N=30 results in 30=2*3*5, then the interconnection network 110 is based on switching elements of size 2×2, 3×3, and 5×5.

Alternatively, it is also possible to use switching elements with size based on (prime and non-prime) submultiples of N whose product is equal to N. For example, for N=30, it is also possible to use switching elements of size 6×6 and 5×5, or of size 15×15 and 2×2.

Conveniently, the switching elements' size may be chosen to reduce the architectural complexity or the number of used FPGA LEs.

Thence, the flexibility represents another advantage of the interconnection network according to the present invention.

Conveniently, the interconnection network 110 is based on a factorization of N=30 into primes 2, 3, 5 and, hence, includes three stages, wherein a stage includes 30/5=6 5×5 switching elements, another stage includes 30/3=10 3×3 switching elements, and a further stage includes 30/2=15 2×2 switching elements.

Instead, if N were equal to 120 and were decomposed into submultiples 2, 3, 4, 5, the interconnection network would include four stages, wherein a stage would include 120/5=24 5×5 switching elements, another stage would include 120/4=30 4×4 switching elements, a further stage would include 120/3=40 3×3 switching elements, and a yet further stage would include 120/2=60 2×2 switching elements.

More in general, an interconnection network according to the present invention includes N inputs and N outputs (N being a non-prime positive integer) and M stages;

wherein M is a positive integer equal to, or higher than, two, and denotes a number of predefined submultiples $\{sm_1, \ldots, sm_M\}$ of N whose product is equal to N—namely, in mathematical terms, $$\prod_{i=1}^{M} sm_i = N;$$

and wherein each stage i (with i=1, ..., M) is associated with a respective submultiple $sm_i$ of said predefined submultiples $\{sm_1, \ldots, sm_M\}$ of N, and includes $S_i$ respective cyclic-shift-register-like switching elements, each having $sm_i$ inputs and $sm_i$ outputs, wherein $S_i=N/sm_i$.

Figure 8:
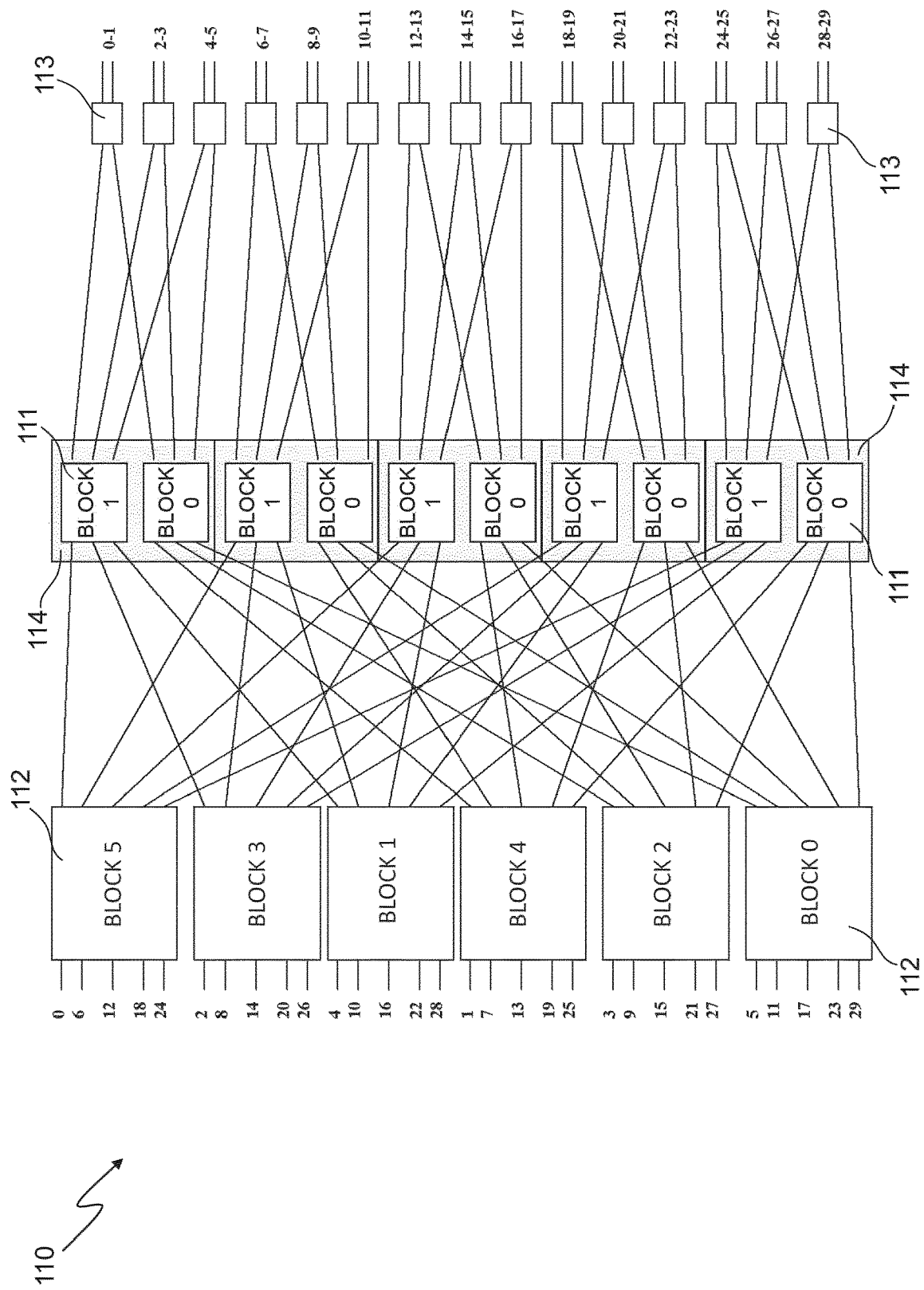
FIGS. 8 and 10 schematically illustrate an example of architecture for the interconnection network according to said preferred embodiment of the present invention.

FIG. 8 shows an example of architecture for the interconnection network 110 based on a factorization of N=30 into primes 2, 3, 5 (thereby resulting in M=3 stages). In the example of FIG. 8, the interconnection network 110 includes:

a first stage (i=1) associated with the factor (more in general, the submultiple) $sm_1=5$ and comprising six (i.e., $S_1=6$) 5×5 switching elements 112 designed to operate as a sort of cyclic shift registers;
a second stage (i=2) associated with the factor (more in general, the submultiple) $sm_2=3$ and comprising ten (i.e., $S_2=10$) 3×3 switching elements 111 designed to operate as a sort of cyclic shift registers (as shown in FIG. 7 and previously described); and
a third stage (i=3) associated with the factor (more in general, the submultiple) $sm_3=2$ and comprising fifteen (i.e., $S_3=15$) 2×2 switching elements 113, wherein said 2×2 switching elements 113 may be conveniently implemented by means of the binary switching element shown in FIG. 1.

Therefore, the greatest switching elements (i.e., the 5×5 ones) are arranged at the first stage and the size of the switching elements decreases as the index i of the stages increases. However, also the opposite arrangement may be conveniently used.

The outputs of the 5×5 switching elements 112 of the first stage are connected to the inputs of the 3×3 switching elements 111 of the second stage so as to generate (i.e., form) five interconnection sub-networks of size $N/sm_1=30/5=6$.

In particular, at the second stage, the 3×3 switching elements 111 are organized (i.e., grouped) into five sub-stages 114, each including two 3×3 switching elements 111, and the first output pin of each of the six 5×5 switching elements 112 is connected to a first sub-stage 114

(specifically, to an input pin of a 3×3 switching element 111 belonging to said first sub-stage 114);

the second output pin of each of the six 5×5 switching elements 112 is connected to a second sub-stage 114 different from the first sub-stage 114 (specifically, to an input pin of a 3×3 switching element 111 belonging to said second sub-stage 114);

the third output pin of each of the six 5×5 switching elements 112 is connected to a third sub-stage 114 different from said first and second sub-stages 114 (specifically, to an input pin of a 3×3 switching element 111 belonging to said third sub-stage 114);

the fourth output pin of each of the six 5×5 switching elements 112 is connected to a fourth sub-stage 114 different from said first, second and third sub-stages 114 (specifically, to an input pin of a 3×3 switching element 111 belonging to said fourth sub-stage 114); and the fifth output pin of each of the six 5×5 switching elements 112 is connected to a fifth sub-stage 114 different from said first, second, third and fourth sub-stages 114 (specifically, to an input pin of a 3×3 switching element 111 belonging to said fifth sub-stage 114);

whereby five interconnection sub-networks of size $N/sm_1=30/5=6$ are formed from the 5×5 switching elements 112 of the first stage towards the 3×3 switching elements 111 of the second stage.

Moreover, for each sub-stage 114 and, hence, for each interconnection sub-network of size 6, the first output pins of the two 3×3 switching elements 111 belonging to said sub-stage 114 are connected to one and the same respective first 2×2 switching element 113 (in particular, to the two input pins thereof);

the second output pins of the two 3×3 switching elements 111 belonging to said sub-stage 114 are connected to one and the same respective second 2×2 switching element 113 (in particular, to the two input pins thereof); and the third output pins of the two 3×3 switching elements 111 belonging to said sub-stage 114 are connected to one and the same respective third 2×2 switching element 113 (in particular, to the two input pins thereof);

whereby the sub-stages 114 generate (i.e., form), towards the 2×2 switching elements 113, three further interconnection sub-networks of size $N/(sm_1 \times sm_2)=30/(5\times 3)=2$ for each interconnection sub-network of size 6.

More in general, for an interconnection network of size N, said size N is decomposed/factorized into submultiples/prime factors $sm_1*sm_2*sm_3$.

Thence, the first stage includes $N/sm_1$ switching elements of size $sm_1 \times sm_1$, which generate $sm_1$ interconnection sub-networks of size $N/sm_1$.

At the second stage, $N/(sm_1*sm_2)$ switching elements of size $sm_2 \times sm_2$ are used for each sub-network of size $N/sm_1$, and at the second stage there are, in total, $$\frac{N}{sm_1*sm_2}*sm_1 = \frac{N}{sm_2}$$

switching elements of size $sm_2 \times sm_2$.

At the third stage, $N/(sm_1*sm_2*sm_3)$ switching elements of size $sm_3 \times sm_3$ are used for each sub-network of size $N/(sm_1*sm_2)$, and at the third stage there are, in total, $$\frac{N}{sm_1*sm_2*sm_3}*sm_1*sm_2 = \frac{N}{sm_3}$$

switching elements of size $sm_3 \times sm_3$.

The same applies for further stages of interconnection networks having more than three stages.

Considering two immediately successive stages i and i+1, for each switching element $sm_i \times sm_i$ of the stage i, the $sm_i$ output pins of said switching element $sm_i \times sm_i$ are connected to $sm_i$ different interconnection sub-networks: the first output pin is connected to the first sub-network, the second output pin is connected to the second sub-network, and so on up to the $sm_i$-th output pin. This applies to all the existing switching elements and all the existing sub-networks at that level.

As shown in FIG. 8, the output pins of the 2×2 switching elements 113 of the last stage are directly connected to the output terminals of the interconnection network 110 with no numbering reorganization.

On the contrary, the input pins of the 5×5 switching elements 112 of the first stage are connected to the input terminals of the interconnection network 110 reorganizing them in a different order, that is indicated by the labeling order in FIG. 8.

In order for the algorithm for defining the reorganization labeling order to be better understood and in order to define where the k-th input terminal of the interconnection network 110 is to be connected, the k-th output terminal is conveniently searched. Then it is possible to proceed across the network 110 from output to input, from the third stage (i.e., the 2×2 switching elements 113), up to the second stage (i.e., the 3×3 switching elements 111) until the first stage is reached (i.e., the 5×5 switching elements 112). In finding the route, the switching elements 113, 111 and 112 are considered as set in pass-through permutation (direct connection—i.e., no shift). So the numbers shown at the input terminals of the interconnection network 110 in FIG. 8 are easily determined, showing the reassignment order.

The interconnection network 110 has to be able to carry out a cyclic shift; thence, this allows the size of the sub-networks to be reduced from the first stage to the last one, as it will be explained. In the example shown in FIG. 8, due to Clos networks partitioning and factorization rules, the first stage subdivides the original 30×30 network into 5 different 6×6 sub-networks, that include elementary switching elements 111,113 from the second and third (output) stages. In the third (output) stage, there are 15 different 2×2 switching elements 113; when an input value, from the first stage to the second one and finally to the third one, is routed towards a smaller sub-network, then that value cannot be routed outside in another sub-network. For this reason, the interconnection network 110 is able (specialized) to realize cyclic shifts; this is not a limitation for FEC codecs but rather, merely a complexity simplification.

It is worth noting that, from a conceptual point of view, the interconnection network 110 represents only a non-limiting example of an interconnection network according to the present invention. In fact, although the interconnection network 110 of size thirty includes three stages, each associated with a respective submultiple of thirty (i.e., five, three and two, respectively), wherein the three stages are arranged, from the first stage to the last one, according to a decreasing order of the aforesaid submultiples of thirty, an interconnection network according to a more general embodiment of the present invention has a generic size N (with N non-prime positive integer decomposed/factorized into a certain number M of given submultiples, with M positive integer equal to, or higher than, two) and includes M stages that may be conveniently arranged, from the first stage to the last stage, according to a decreasing or increasing order (or, even more in general, according to any order) of said given submultiples of N. Said interconnection network according to said more general embodiment of the present invention can be considered as comprising $sm_i$ interconnection "main" sub-networks (with $sm_i$ denoting the submultiple, among said given submultiples of N, that is associated with the first stage of the interconnection network) for routing, each, $N/sm_i$ respective input values from $N/sm_i$ respective output pins of the switching elements of the first stage to $N/sm_i$ respective input pins of the switching elements of the last stage; wherein each "main" interconnection sub-network conveniently includes, for each pair of immediately successive stages i and i+1 after the first one, $sm_i$ respective hardwired interconnection "sub-subnetworks", with $sm_i$ denoting the submultiple (among said given submultiples of N) that is associated with the stage i. For example, in case of an interconnection network of generic size N (again, with N decomposed/factorized into a certain number of given submultiples) with stages arranged, from the first stage to the last one, according to a decreasing order of the given submultiples of N (such as the interconnection network 110 in the non-limiting example of FIG. 8), there are $sm_{max}$ interconnection "main" sub-networks (with $sm_{max}$ denoting the greatest submultiple among said given submultiples of N, which greatest submultiple is associated with the first stage—e.g., five in the interconnection network 110) for routing, each, $N/sm_{max}$ respective input values from $N/sm_{max}$ respective output pins of the switching elements of the first stage (e.g., six respective output pins of the 5×5 switching elements 112 of the interconnection network 110) to $N/sm_{max}$ respective input pins of the switching elements of the last stage (e.g., six respective input pins of the 2×2 switching elements 113 of the interconnection network 110). Moreover, with specific reference to the non-limiting example of FIG. 8, for each of the five interconnection "main" sub-networks of the interconnection network 110, there are three respective hardwired interconnection "sub-subnetworks" between the respective 3×3 switching elements 111 of the second stage and the respective 2×2 switching elements 113 of the third stage.

As for the self-routing algorithm of the interconnection network 110, let us assume that a cyclic shift (i.e., the number of positions to be shifted) ρ is required at a clock cycle, which means that, given a bit vector received at the input terminals of the interconnection network 110, said interconnection network 110 has to provide, at the output terminals, the bit vector cyclically (or circularly) shifted by ρ.

Hereinafter, rules for commanding the individual switching elements of the interconnection network 110 to achieve a specific cyclic shift ρ will be described.

To this end, it is convenient to define an index j for identifying the switching elements 111, 112 and 113; the same index j can be used for any multistage network with generic number of stages and elementary switches; in particular, j can be obtained by means of the following expression (where, with reference to the example shown in FIG. 8, i=1 for the 5×5 switching elements 112 of the first stage, i=2 for the 3×3 switching elements 111 of the second stage, and i=3 for the 2×2 switching elements 113 of the third stage—in the general case, i denotes the different stages of one and the same interconnection network):

$$j = N * \prod_{l=1}^{i} \frac{1}{sm_l} - 1 - p \bmod \left[ \prod_{l=1}^{i} \frac{1}{sm_l} \right],$$

where p, for the first stage, is the label assigned to the first input to the switching elements 112 of the first sub-network; i.e., 0, 2, 4, 1, 3, 5 depending on the input block chosen.

For the subsequent stages, that aggregate switching elements 111 and 113 in sub-networks, it is sufficient to identify the index j for the second stage and, furthermore, the index j will be repeated for the various sub-networks as shown in FIG. 8.

The interconnection network 110 in FIG. 8 is connected in direct mode (no shift), in order to derive the indexes j. The same rule applies also for sub-networks at the subsequent stages.

The configuration of a generic switching element 111, 112, 113 of the interconnection network 110 may be conveniently computed as:

$$C(\rho, i, j) = \left\{ (\rho + j) \bmod \left[ N * \prod_{l=1}^{i-1} \frac{1}{sm_l} \right] \right\} div \left[ N * \prod_{l=1}^{i} \frac{1}{sm_l} \right], \quad (8)$$

where j assumes the following values $$j \in \left[ 0; \left( N * \prod_{l=1}^{i} \frac{1}{sm_l} \right) - 1 \right]$$

and the following convention applies $$\prod_{l=1}^{0} \frac{1}{sm_l} \triangleq 1.$$

C(ρ,i,j) denotes the switching element configuration command; it depends on three independent variables, the number of shift positions ρ, the stage i and the label (index) j assigned to the switching element.

For the second and third stages, j is obtained by the same formula in which p is obtained by following the network backwards from the first upper input of the switching element, considering the network connected in a pass-through mode, and reaching the first stage input label index. So, starting from the upper rightmost switching element 113, there results j=0. This confirms that various sub-networks will inherit the same switch control commands.

In this connection, attention is drawn to the fact that the various indexes j (namely, (BLOCK) 5, 3, 1, 4, 2, 0) univocally identifying the 5×5 switching elements 112 within the first stage, and the two indexes j (namely, (BLOCK) 1,0) univocally identifying the two 3×3 switching elements 111 within each sub-stage 114 are shown in FIG. 8; instead, as just explained, all the 2×2 switching elements 113 can be identified by one and the same index j=0.

Therefore, for the configuration of the switching elements 112 of the first stage, the equation (8) becomes:

[(ρ+j)mod 30]div 6.

Three bits are sufficient for the configuration of the switching elements 112, since the connection of a switch 5×5 is specified by a number included in the range [0;4].

Moreover, for the configuration of the switching elements 111 of the second stage, the equation (8) becomes:

$$[(\rho+j) \bmod 6] \operatorname{div} 2.$$

Two bits are sufficient for the configuration of the switching elements 111, since the connection of a switch 3×3 is specified by a number included in the range [0;2].

Finally, for the configuration of the switching elements 113 of the third stage, the equation (8) becomes:

$$\rho \bmod 2.$$

One bit is sufficient for the configuration of the switching elements 113.

Again with reference to FIG. 8, it is worth noting that the input terminals on the left side of the interconnection network 110 are labeled with a number corresponding to the index of the input vector, included in the range [0:29]. The same applies for the output vector.

Each 5×5 switching element 112 of the first stage can be identified by a number included in the range [0:5] (since there are six different 5×5 switching element 112). This number denotes the block label or index j. This index j is useful because it simplifies the implementation of the routing algorithm; it is an input parameter of the routing algorithm. As previously said, the index j is represented in FIG. 8: from the top to the bottom, the labels are 5, 3, 1, 4, 2, 0.

The same approach is used for the 3×3 switching elements 111 of the second stage. It has to be noted, though, that conceptually the last two stages can be interpreted as five separate and replicated 6×6 interconnection sub-networks; then, the same index j can be reused for all the replicated sub-networks. This result stems from the fact that the interconnection network 110 has to be able to perform a cyclic shift; moreover, the routing algorithm is performed with a recursive approach. Then, the routing complexity decreases in the subsequent stages. In fact, at the first stage, an input vector of size 30 is to be shifted. At the second stage, the complexity is only 30/5=6; namely, five different vectors (generated from the input one) of size 6 have to be shifted. These vectors corresponds to the input of each 6×6 sub-network, downstream of the first stage. This justifies the fact that in the second stage only two indexes j are used. These two indexes are shown in FIG. 8 and are included in the range [0:1] (since there are five identical and independent 6×6 sub-stages 114). In practice, the corresponding switches of the replicated sub-networks, from the second stage to the last one, will be denoted with the same label.

Figure 9:
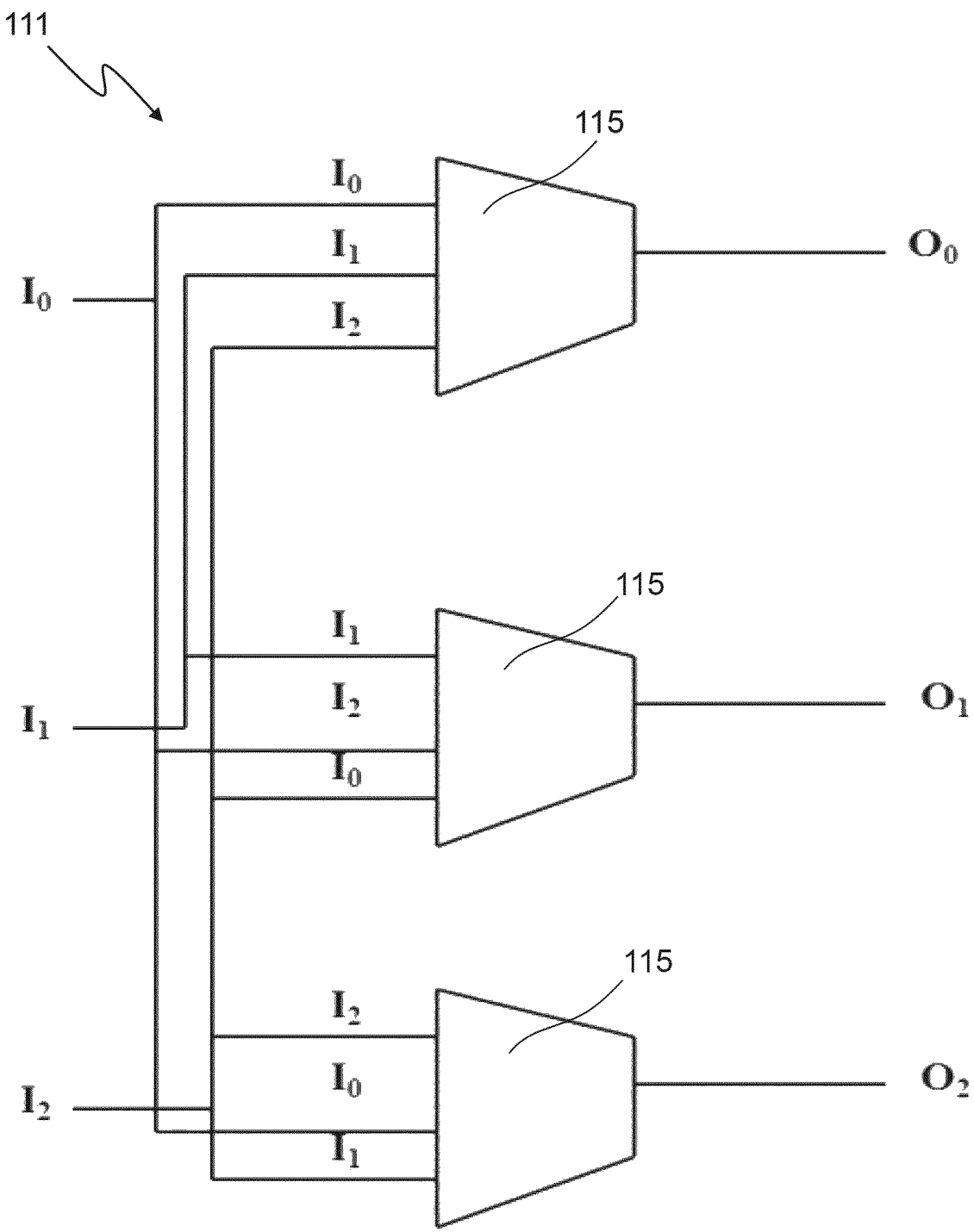
FIG. 9 shows a preferred architecture for the 3×3 switching element of FIG. 7.

A preferred architecture for the 3×3 switching elements 111 is shown in FIG. 9. In particular, as shown in FIG. 9, the 3×3 switching elements 111 are preferably realized, each, by means of three multiplexers 115, each connected to all the three inputs $I_0$, $I_1$, $I_2$ of the 3×3 switching element 111, so as to be operable to output one of said three inputs depending on the control signal(s) received. In detail, this structure allows to have the same selector for all the multiplexers 115, which define the elementary switching elements 111.

The same structure is preferably used also for the 5×5 switching elements 112 and the 2×2 switching element 113; so, all the switches are implemented with the same hardware approach. This property derives from the particular recursive routing algorithm. This also implies that the number of stage is roughly:

$$\sim N \log N,$$

reminding that N denotes the size of the input and output vectors and, hence, of the interconnection network 110.

In a general application not limited to shifts, the number of stage is at least equal to:

$$\sim 2 * N \log N.$$

Figure 10:
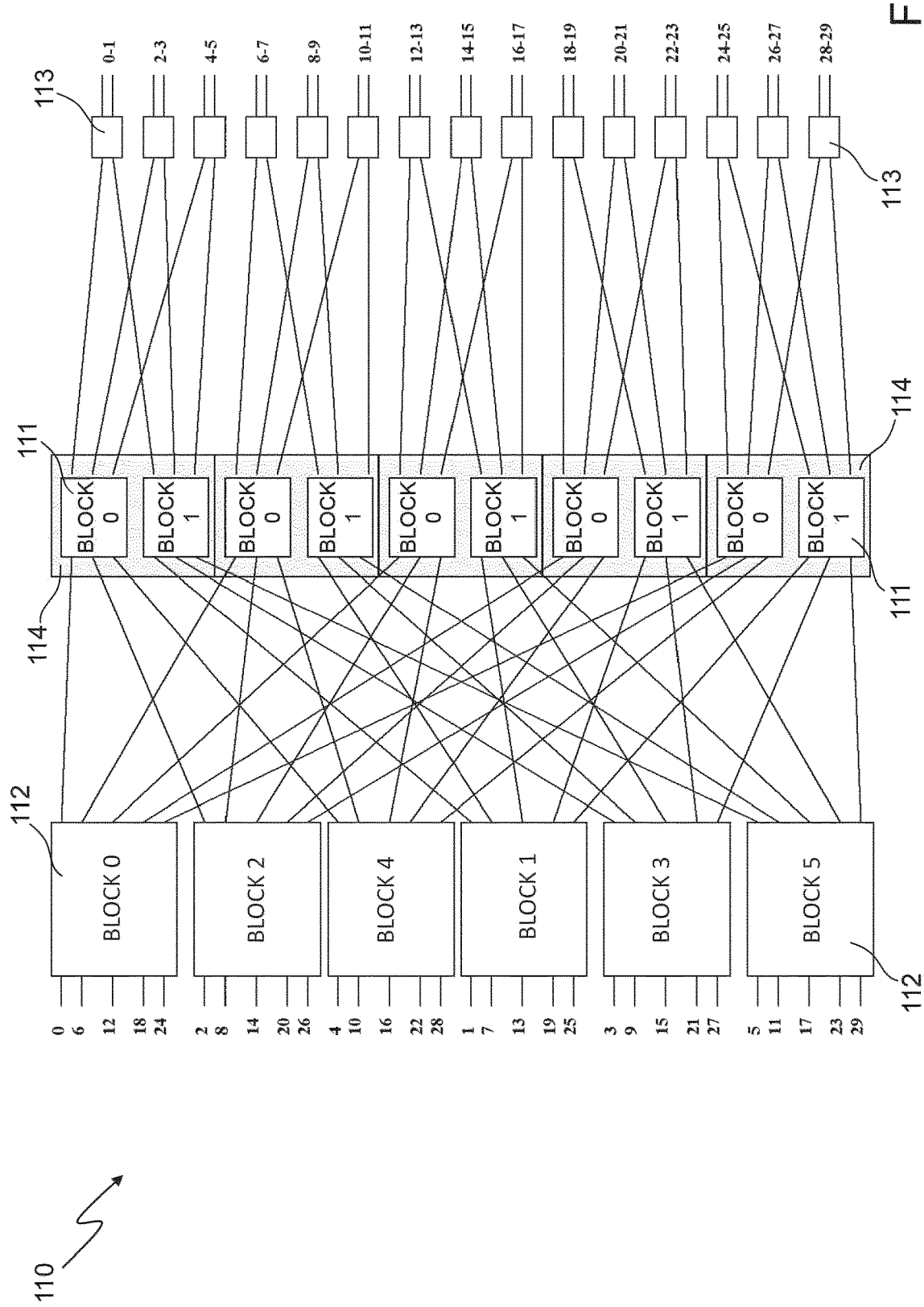

FIG. 10 shows the interconnection network 110 with the same features as FIG. 8, but with different labels/indexes j assigned to the 3×3 switching elements 111 and the 5×5 switching elements 112.

By applying the above routing algorithm (in particular, the equation (8)) to the 5×5 switching elements 112 as labelled in FIG. 10, there results:

$$\text{Selector}_{5\times5}=[(\rho+5-j) \bmod 30] \operatorname{div} 6.$$

The selector of the 5×5 switching elements 112 is obviously included in the range [0:4], since it has to be able to shift the 5-size input vector in a generic way. As a matter of fact, the integer division by six of a number included in the range [0:29] is a number higher than or equal to zero and lower than or equal to four.

As for the 3×3 switching elements 111, there results:

$$\text{Selector}_{3\times3}=[(\rho+1-j) \bmod 6] \operatorname{div} 2.$$

The selector of the 3×3 switching elements 111 is included in the range [0:2]; it is able to shift the 3-size input vector in a generic way. As a matter of fact, the integer division by 2 of a number included in the range [0:5] (that is the result of the 6-mod operation) is a number higher than or equal to zero and lower than or equal to two.

Finally, the single bit required to select the output of the 2×2 switching elements 113 of the last stage is simply:

$$\rho \bmod 2.$$

For example, if $\rho=1$ and $\text{Selector}_{5\times5}$ (j) denotes the selector of the j-th 5×5 switching element 112, then the following results are obtained:

$$\text{Selector}_{5\times5}(j)=0 \text{ if } j\neq 0,$$

$$\text{Selector}_{5\times5}(j)=1 \text{ if } j=0.$$

Moreover, if $\rho=1$ and $\text{Selector}_{3\times3}(j)$ denotes the selector of the j-th 3×3 switching element 111, then the following results are obtained:

$$\text{Selector}_{3\times3}(j)=1 \text{ if } j=0,$$

$$\text{Selector}_{3\times3}(j)=0 \text{ if } j=1.$$

Finally, all the 2×2 switching elements 113 have the same selection, on the basis of the network construction and subdivision; so, the $\text{Selector}_{2\times2}$ is:

$$\rho \bmod 2=\bmod 2=1$$

Figure 11:
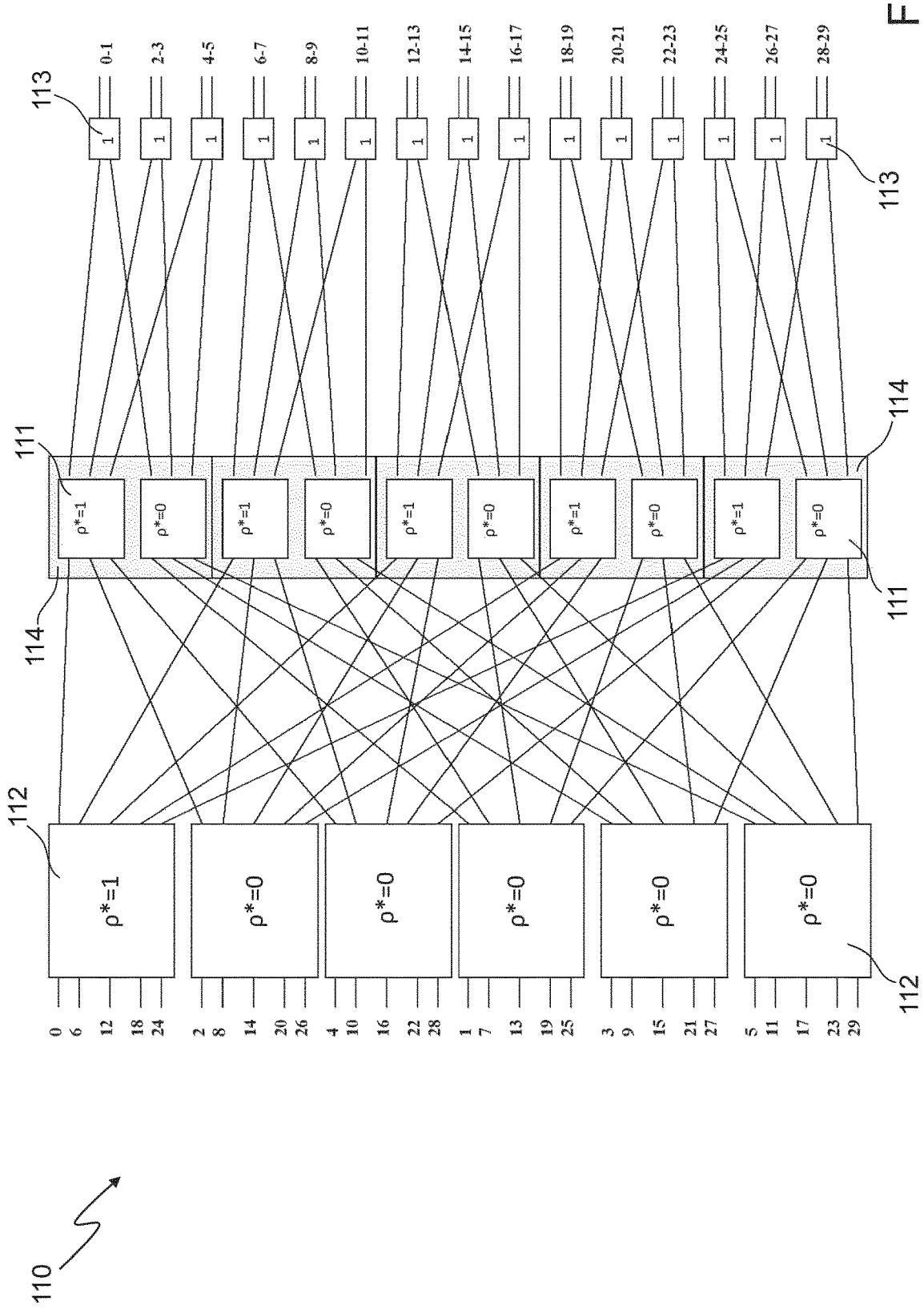
FIGS. 11-17 schematically illustrate examples of cyclic shifts implemented by the interconnection network of FIG. 10.
Figure 12:
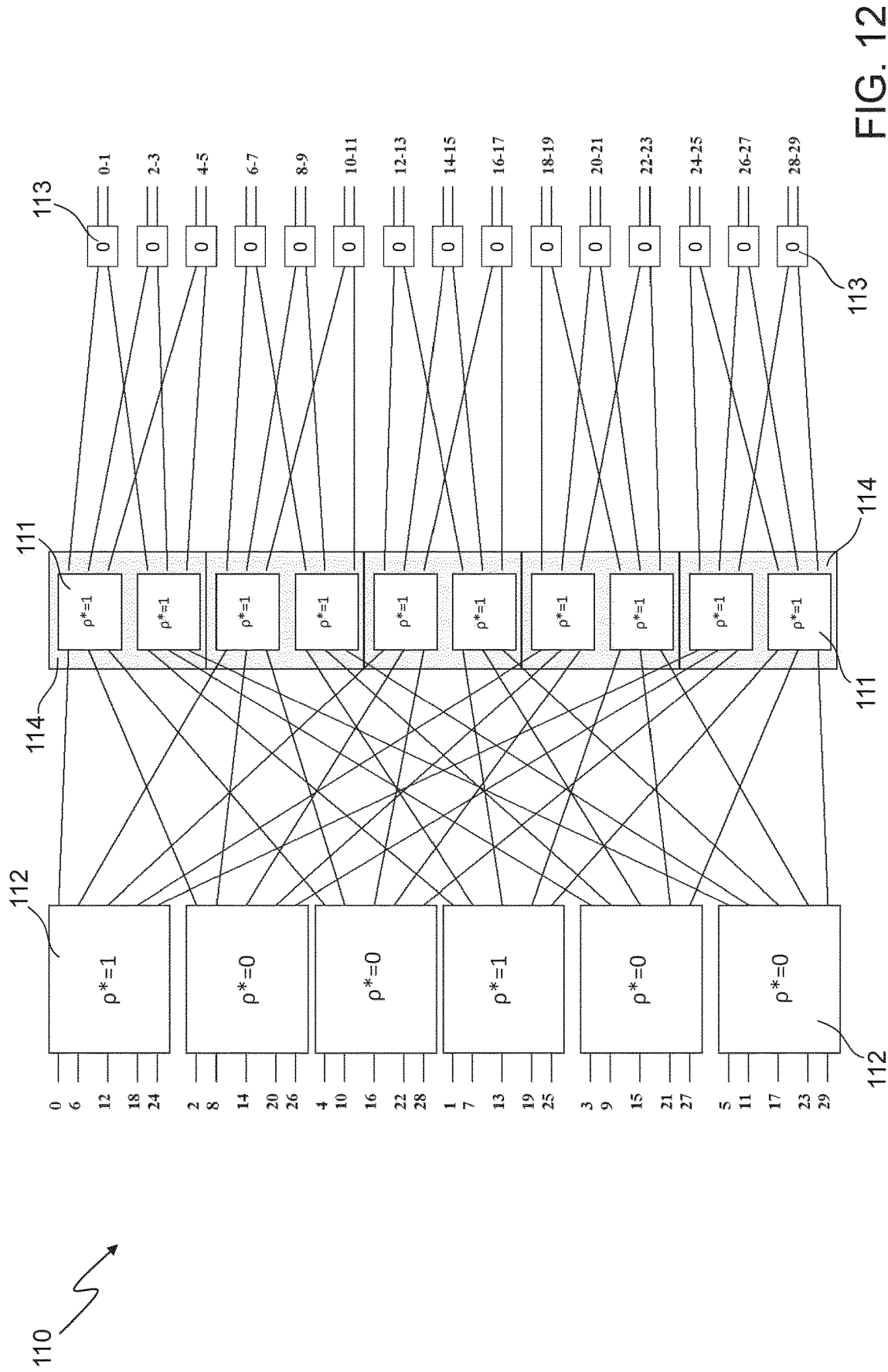
Figure 13:
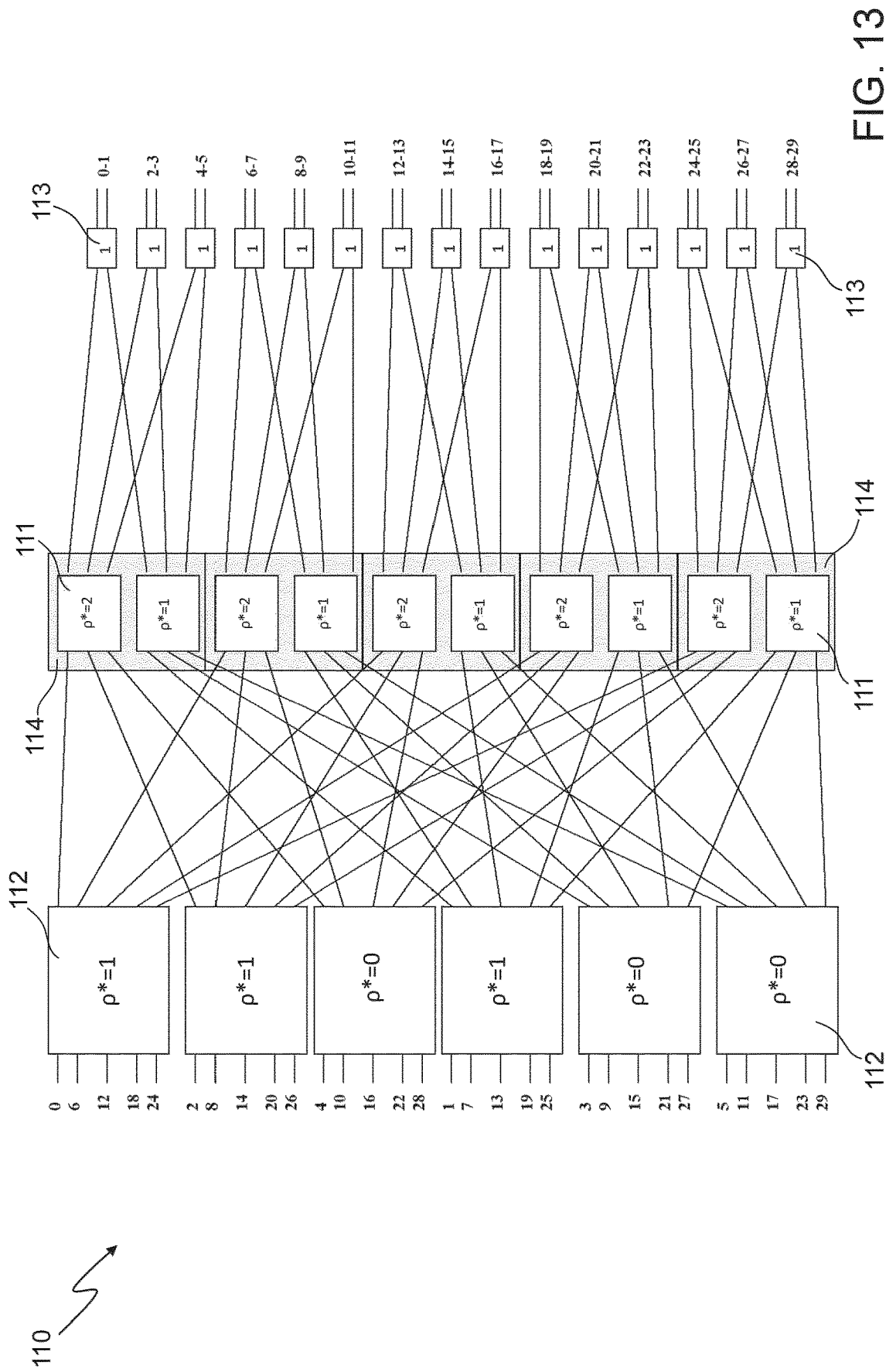
Figure 14:
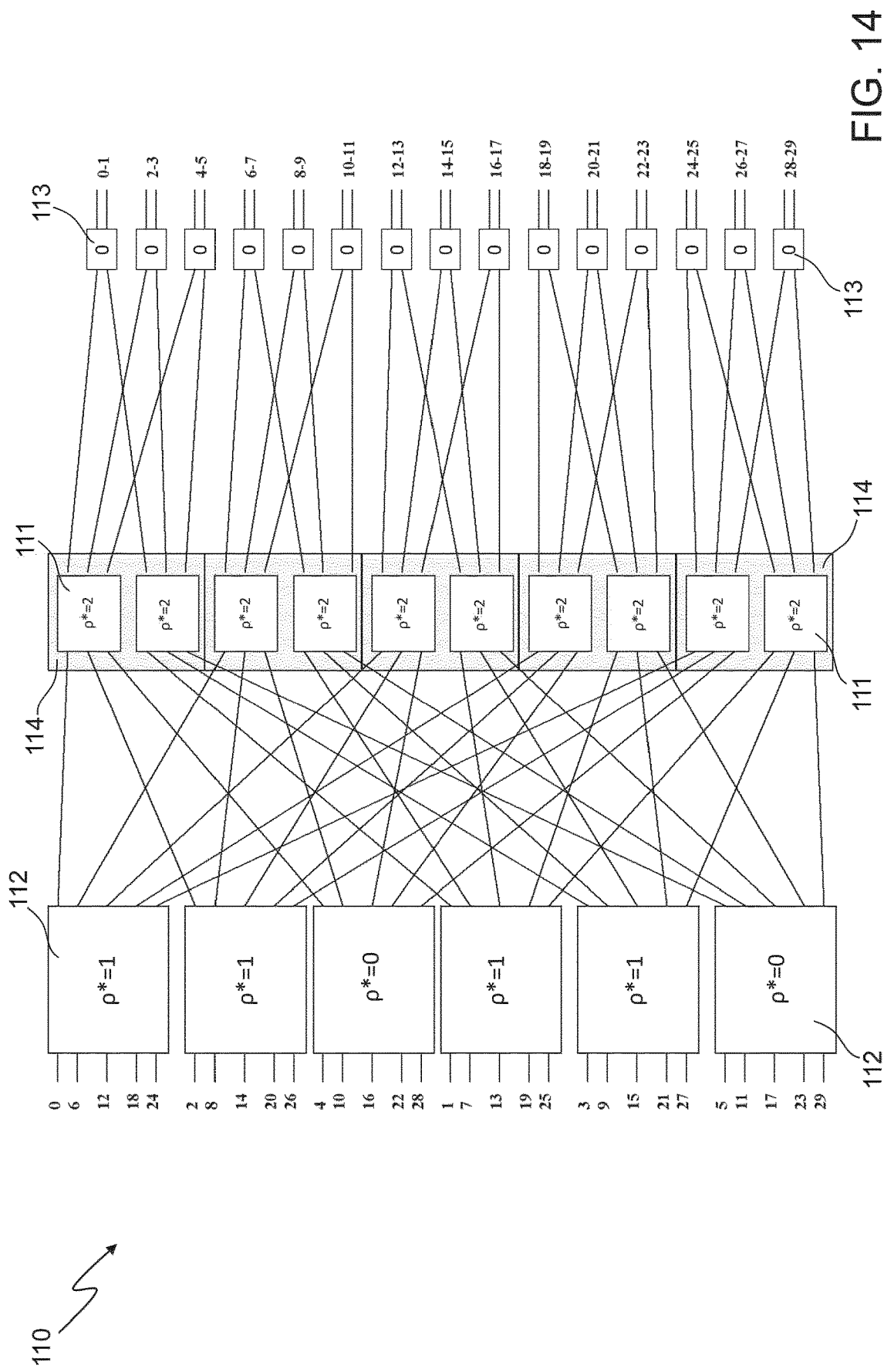
Figure 15:
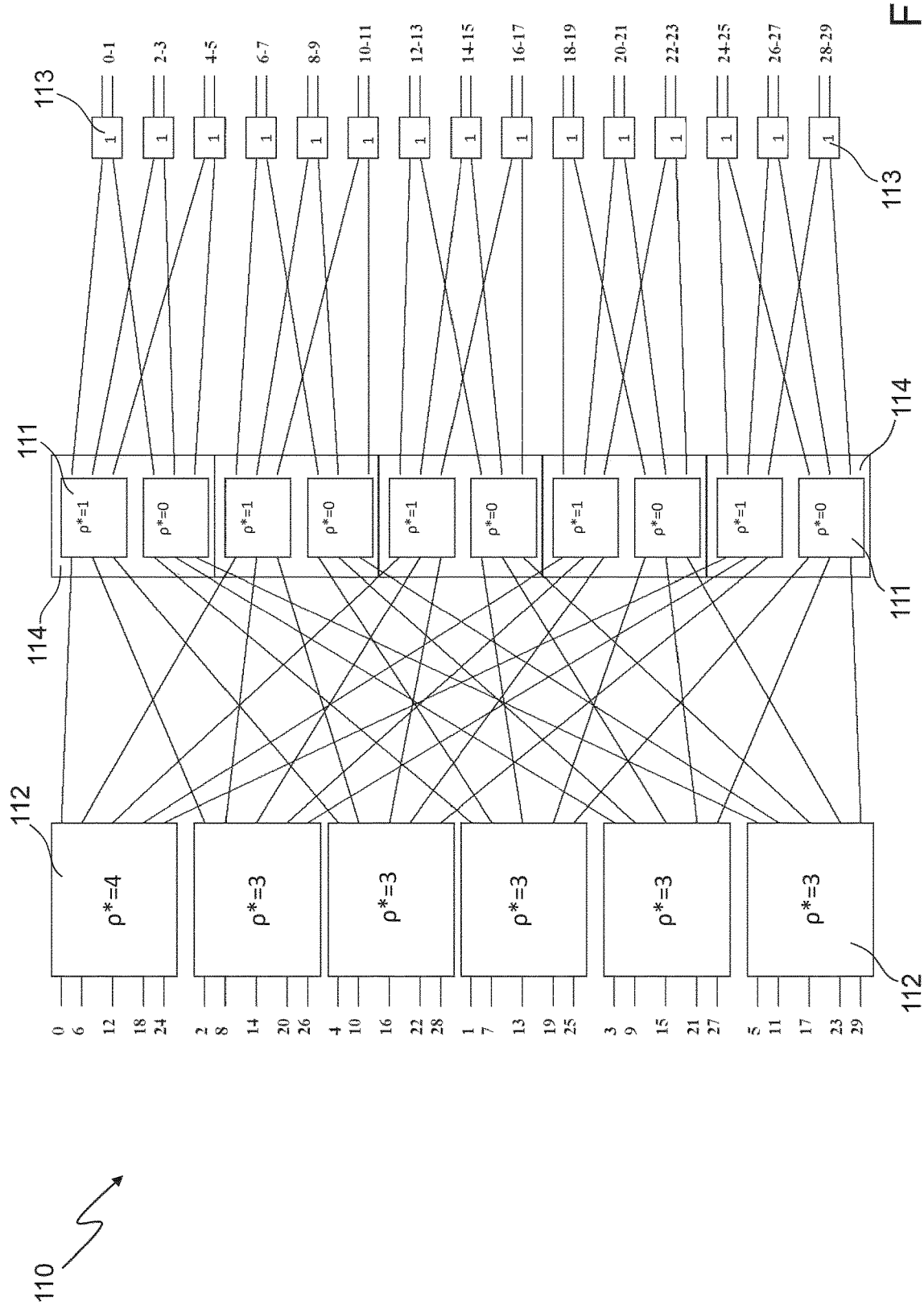
Figure 16:
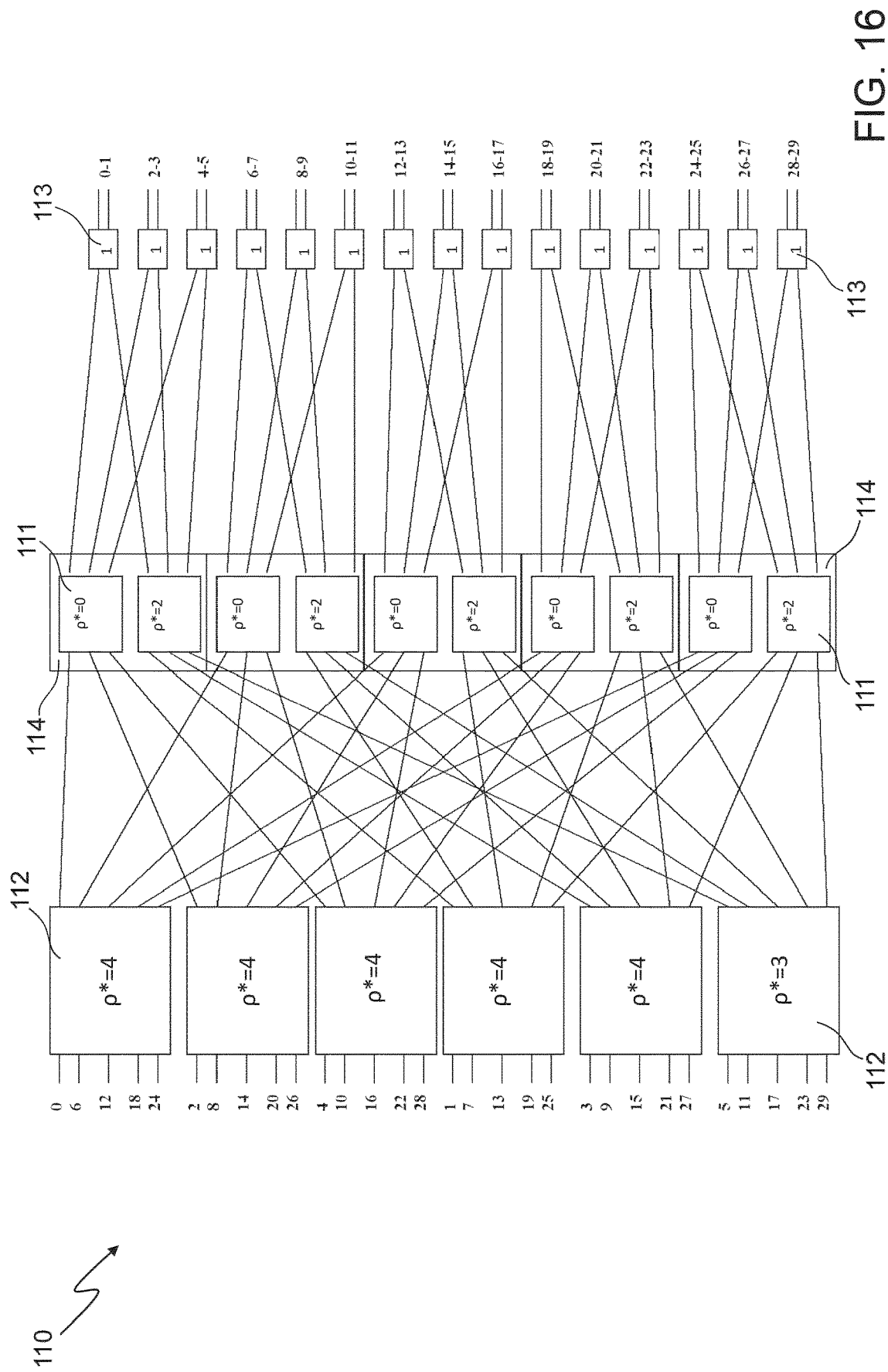
Figure 17:
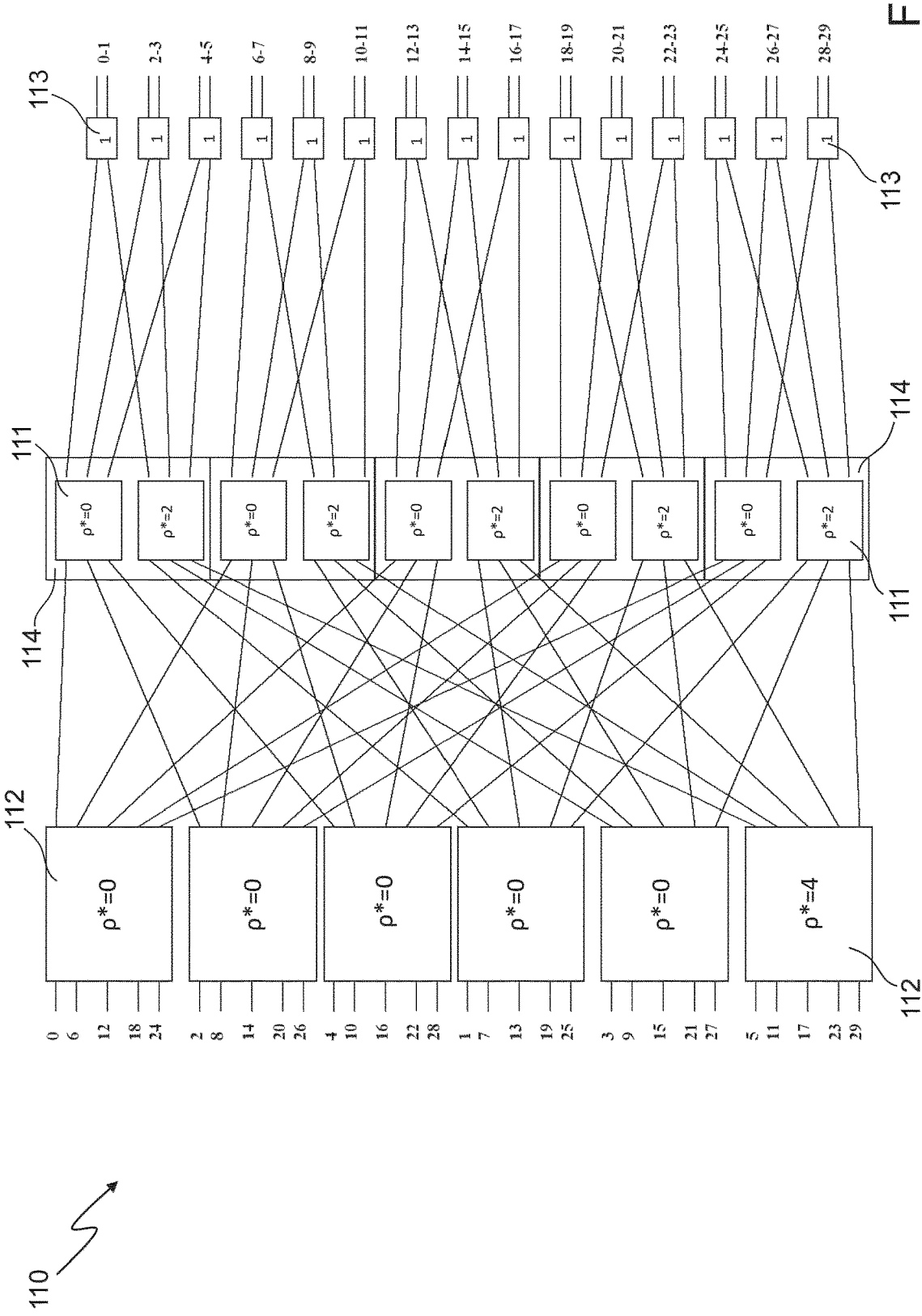

The resulting connection is shown in FIG. 11, where inside each block representing a switching element 111, 112, 113 a corresponding "local" cyclic (or circular) shift $\rho^*$ is shown.

The same reasoning can be applied for a generic overall cyclic shift $\rho$ having value included in the range [0;29] (or, more in general, [0;N−1]). In this connection, FIGS. 12-17 show examples for $\rho=2$, $\rho=3$, $\rho=4$, $\rho=19$, $\rho=23$ and $\rho=29$.

Hereinafter, also an example of application of the interconnection network according to the present invention to LDPC-based DVB-S2 will be described. In particular, in the following the hardware implementation of the co-decoder sections for the DVB-S2 code (in this connection reference can be made to Ref12), initially developed for the CCSDS standard (Ref4, Ref10, Ref11) will be introduced. The first idea for DVB-S2 code implementation, that provides a good speed improvement via multiple SISO processors, is based on the use of memory banks and shift registers.

The DVB-S2 code—for what concerns the LDPC—has been evidently designed over underlying hardware architectural solutions (mostly based on shift registers based on FIFOs or memories) allowing for computational parallelism and minimized hardware requirements. The data exchange between the variable and check nodes is based on rules very similar to the interleaver laws underlying CCSDS standard; this allows to design the same hardware architecture (hence, the same interconnection network and the same routing algorithm) for routing the extrinsic information from variable to check nodes in the LDPC or from the inner codec to the outer one in the PCCC or SCCC codes.

According to DVB-S2 LDPC encoding (Ref10), the algorithm to obtain m parity bits for every k information bits, to construct the k+m=n-bit codeword, is the following:
  initialize to zero the parity bits—$p_0=p_1=p_{(m-1)}=0$;
  the first information bit constitutes one of the XOR operands for the parity check equation specified in the first row of the code generating tables; e.g., for code rate 2/3, the standard document indicates, exploiting associative property, the first double operand XOR:

| | |
|---|---|
| $p_0 = p_0 \oplus i_0$ | $p_{2767} = p_{2767} \oplus i_0$ |
| $p_{10491} = p_{10491} \oplus i_0$ | $p_{240} = p_{240} \oplus i_0$ |
| $p_{16043} = p_{16043} \oplus i_0$ | $p_{18673} = p_{18673} \oplus i_0$ |
| $p_{506} = p_{506} \oplus i_0$ | $p_{9279} = p_{9279} \oplus i_0$ |
| $p_{12826} = p_{12826} \oplus i_0$ | $p_{10579} = p_{10579} \oplus i_0$ |
| $p_{8065} = p_{8065} \oplus i_0$ | $p_{20928} = p_{20928} \oplus i_0$ |
| $p_{8226} = p_{8226} \oplus i_0$ | | the following 359 information bits constitute XOR operands to the parity check equations provided by the following equation:

$$\{x+i*q\} \mod(n_{LDPC}-k_{LDPC}),$$

where x is the index of the parity check equation relevant to the first bit, and i is the index of the information bit itself, q is a characteristic parameter that varies with code rate (r), and is equal to $$q=180*(1-r);$$

the parity check equations to which the $361^{st}$ information bit—indexed as $i_{360}$ since the first is $i_0$—will contribute, are given by the second table row; the following 359 information bits constitute XOR operands to the parity check equations provided by the following general equation:

$$\{x+(i \mod 360)*q\} \mod(n_{LDPC}-k_{LDPC})$$

where x indicates the parity check equation to which the bit indexed with $i_{360}$ contributes;
  after every information has been processed as indicated above, the final parity bit is obtained by the following modifications on the obtained parity check vector (a property stemming from the double diagonal matrix contained in the parity check matrix underlying the presented algorithm):

$$p_i=p_i \oplus p_{i-1}, i=1,2,\ldots,n_{ldpc}-k_{ldpc}-1;$$

the content of $p_i$, with $i=0,\ldots,m-1$, is now equal to the non-systematic part of the codeword.

As it is now clear, it is convenient to partition the k information bits into NS=(1-q) 360-bit blocks. The code generating table of the standard document correspondingly has, as a matter fact, NS rows. Additionally, it is convenient to arrange the parity check equations in blocks of q equations.

The partitioning suggested by the presented algorithm, together with the shift register mode of operation clearly lying under the algorithm can be used to totally avoid multiplexers in the hardware implementation, by using the proposed interconnection network. The Tanner graph edges routing (also referred to as interleaving) can be implemented by cyclic shift registers and, above all, the shift registers can be implemented in the memory blocks of the FPGA, to which a 1 ns access time is typical.

Figure 18:
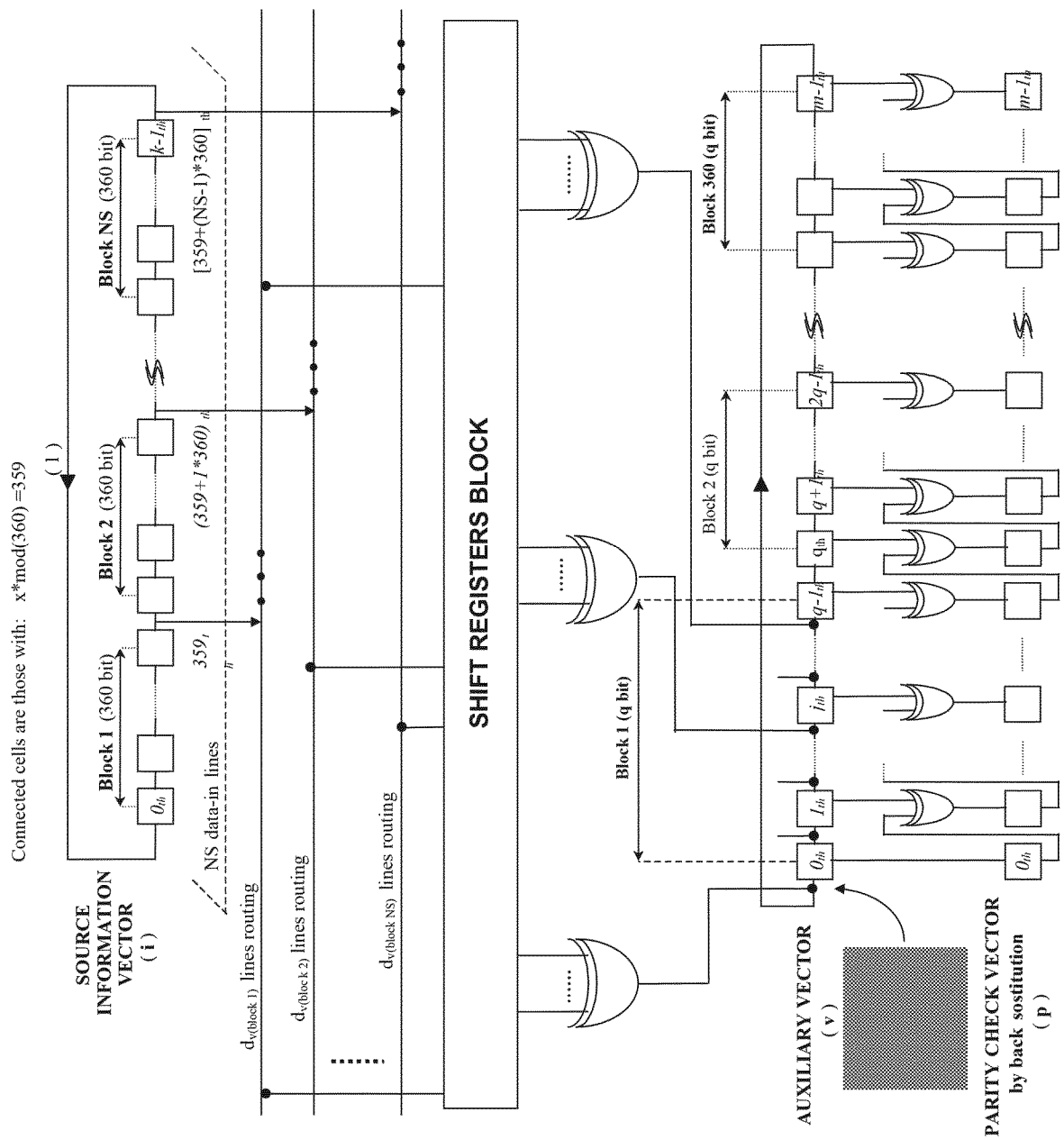
FIG. 18 schematically illustrates DVB-S2 LDPC encoding section architecture according to the prior art.

Following the above reasoning, the schematic presented in FIG. 18 describes the LDPC encoding section hardware architecture, endowed with q parallel XOR processors; every processor takes sequentially charge of 360 parity check equations calculation. The degree of parallelism could also be a multiple of q. For the sake of description simplicity, no details of internal connections of the horizontal bank of shift registers and their organization will be provided, since they can be easily obtained by those skilled in the art.

Loading of upper shift register with incoming data—it is a PING PONG shift register; a copy of it is receiving data bits while the other is feeding them to the memory based shift registers block.

Shift Register (SR) block loading—the upper shift register is operated, producing sequentially the $360^{th}$, $359^{th}$, ... down to the $1^{st}$ bit to the first line going down to the SR block. In parallel, NS other line do a similar operation on the other data blocks. Lines are connected at the upper SR 201 at flip-flops indexed with h*359 with h ranging from 1 to NS.

SR block unloading—the parity check equations are calculated q at a time.

In the above procedure, the contents of the bank of SR after loading is in direct relation with the part $H^d$ of the coding matrix, e.g., the systematic part of it.

To obtain the parity part of the codeword exploiting the double diagonal form of the coding matrix, the simple structure connected to the bottom of the q XOR operators is used. It implements the operation:

$$p_i=p_i \oplus p_{i-1}, i=1,2,\ldots,n_{ldpc}-k_{lpdc}-1.$$

When implementing the decoder architecture, the same solutions used in the encoder architecture can be used. In this connection, FIGS. 19 and 20 show traditional DVB-S2 LDPC decoder architecture; in particular, FIGS. 19 and 20 show flows during first half of an iteration, respectively, from variable node to check node and vice versa.

Figure 19:
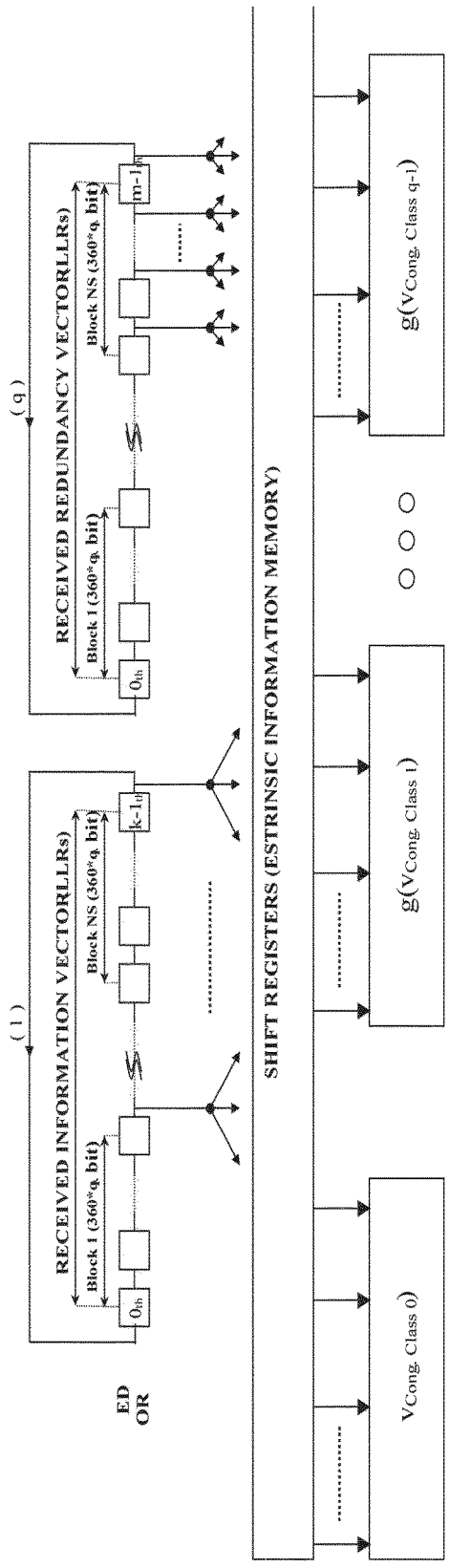
FIGS. 19 and 20 schematically illustrate DVB-S2 LDPC decoding section architecture according to the prior art.
Figure 20:
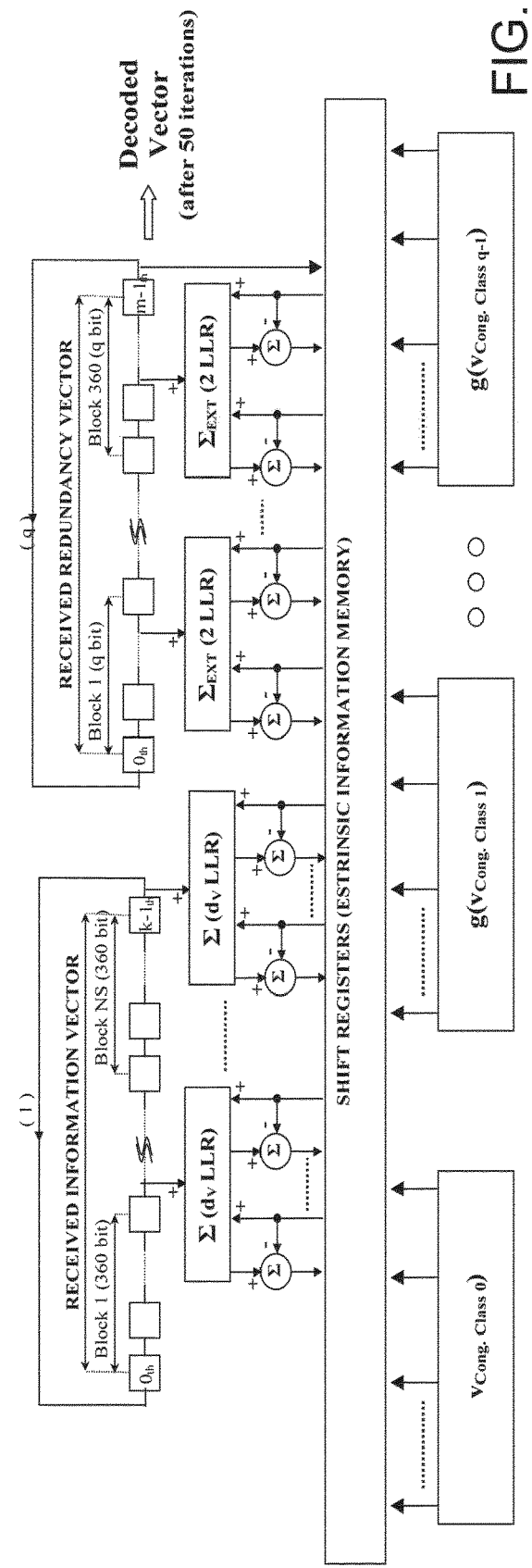

In FIG. 19 the uppermost SRs (once again duplicated, since one is being written with a frame of information from the demodulator while the other is being processed) will contain the LLR bits.

The extrinsic information memory—constituting the means for information exchange among the variable and check nodes—will be constituted by the bank of memory based on SRs, for which, given a 7-bit representation of the LLRs, 7 identical parallel structures will be required to store the 7-bit information, wider than the single bit used in the encoder.

The n LLRs will be partitioned in 180 banks, of 360 log-likelihood ratios (LLRs) each (180*360=64800). The LLRs of the information bits will be contained in the first NS banks; the other remaining q*360 will contain those of the redundancy bits (or parity check bits).

As in the encoding process, a parallel routing of NS LLRs to the bank of memory based on SRs will be executed, and so, with 360 steps, by shifting the upper SR each time, all of the LLRs are loaded in the bank of SRs in the middle of FIG. 19.

The loading of redundancy bits follows a similar process, not described in details but easily obtainable by the properties of the coding matrix.

When the extrinsic information memory SRs are fully loaded, information can be processed by the q parallel check node processors. The g(*) operator provides the messages that must be re-routed to the variable nodes:

$$m^1(c_k, v_j) = g(m^1(v_1, c_k), m^1(v_2, c_k), \ldots, m^1(v_i, c_k), \ldots, m^1(v_n, c_k))$$

a check node is connected to de variable nodes, and for each of them the above equation must be applied. To that purpose, messages will be updated using a specific operator.

After 359 shifts of the registers, all of the messages have been processed, and ready to get to the variable node processors. Updated messages will be calculated as follows:

$$m^{l+1}(v_i, c_k) = m_i + \sum_{\substack{j=1 \\ j \neq k}}^{d_{v_i}} m^l(c_j, v_j); \forall\, i = 1, 2, \ldots, n.$$

In the variable nodes the only operation to be executed is the sum.

With the above defined architecture, variable to check node message computation and passing requires:

$$360 * T_{pg} + L$$

clock cycles, due to the necessary complete shifts of the SRs, which have a size equal to 360. The parameter $T_{pg}$ is the required elaboration time of the processors, whereas L is the latency time.

Analogously, the check nodes to variable nodes message passing requires a time:

$$360 * T_{sum} + L,$$

where $T_{sum}$ is the time required to execute a sum and L is a latency time. The parameter L of the check nodes to variable nodes message passing is not necessarily identical to the homonymous parameter for variable to check nodes message passing.

The interconnection network according to the present invention is able to perform the 360 shifts of the several SRs shown in FIG. 20 simply in one clock cycle, unless the initial latency at the start of a codeword processing.

Then, the hardware architecture based on the present invention is very similar to the traditional (i.e., standard) one, except for the part in charge of the routing of the data from the variable nodes to the check nodes and vice versa (i.e., the interconnection network according to the present invention).

Figure 21:
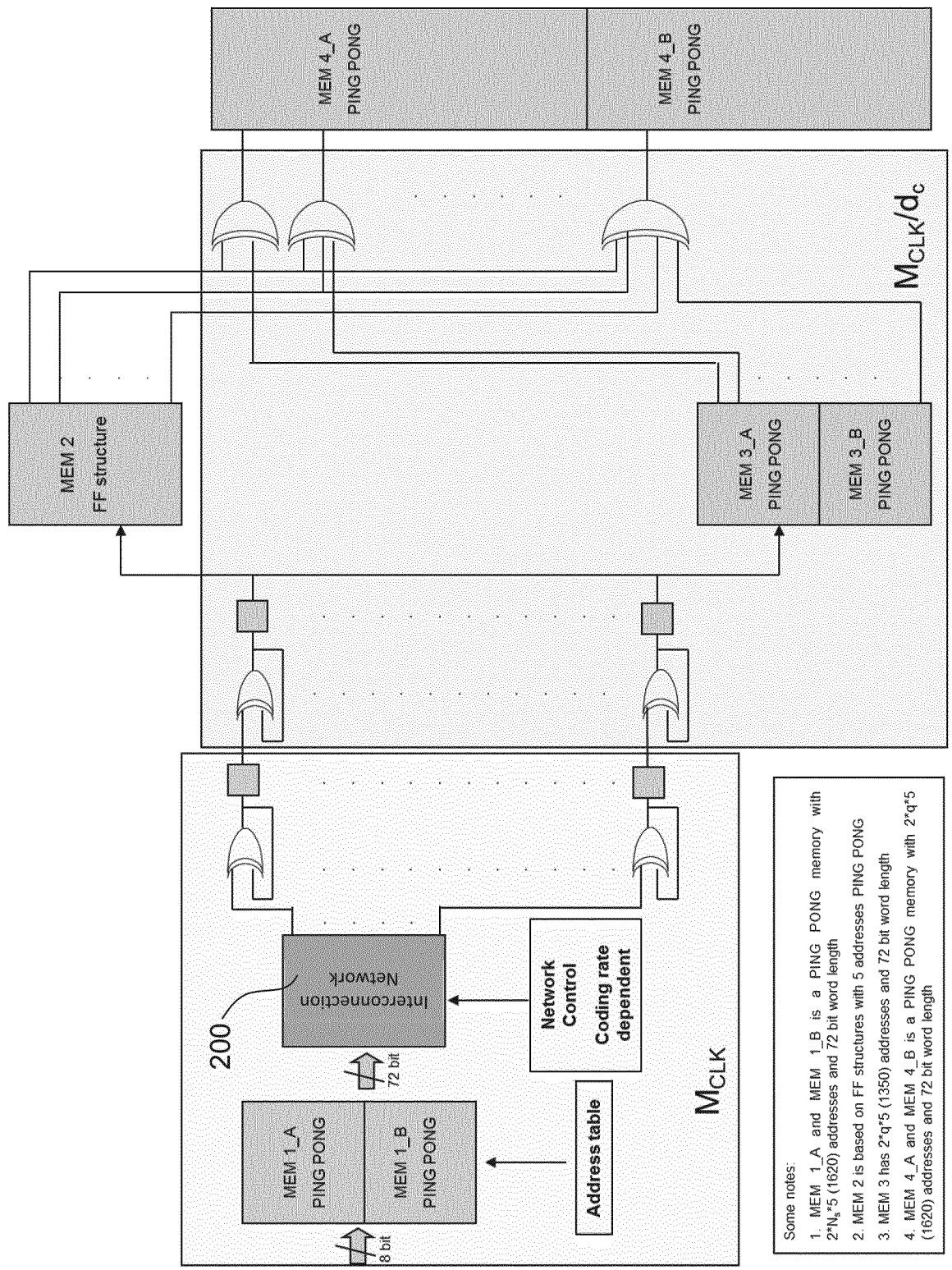
FIG. 21 schematically illustrates DVB-S2 LDPC decoding section architecture provided with an interconnection network according to the present invention.

The block diagram of the proposed solution is shown in FIG. 21, where the shift registers are replaced by an interconnection network 200 according to the present invention (i.e., implemented according to the above teachings of the present invention); this architecture has two dramatic advantages compared to the previous one:
- reduced processing time, since the interconnection network 200 is able to perform a generic number p of shifts in one clock cycle; the previous architecture, instead, needs ρ clock cycles;
- reduced hardware requirements—the interconnection subnetworks of the interconnection network 200 intrinsically simplify the routing problem, by reducing the hardware constraint in terms of LEs and number of physical connections.

The parallelism degree is equal to 360 independently on the coding rate, whereas the processing time required to perform the encoding of one codeword is equal to the characteristic parameter q of the chosen coding rate.

From the foregoing description, the technical advantages of the present invention are immediately clear.

In particular, it is important to point out that the present invention provides an extremely simple routing algorithm, which requires low hardware resources and, above all, does not limit the maximum data rate because its computation can be carried out in real time.

In addition, the interconnection network according to the present invention reduces the hardware requirements compared to the Benes network, as well as the Clos ones.

In this connection, the following Table 2 shows a comparison between the interconnection network according to the present invention and an implementation based on the Benes network. The interconnection network according to the present invention reduces by at least 40-50% the hardware requirements in terms of logic elements (LEs).

TABLE 2

| Interconnection network according to the invention | | Benes network | | |
|---|---|---|---|---|
| Inputs | Occupation (number of required LEs per bit) | Size | Occupation (number of required LEs per bit) | Occupation Ratio |
| 12 | 36 | 16 | 112 | 32.14% |
| 16 | 48 | 16 | 112 | 42.86% |
| 24 | 96 | 32 | 288 | 33.33% |
| 32 | 160 | 32 | 288 | 55.56% |
| 36 | 144 | 64 | 704 | 20.45% |
| 48 | 240 | 64 | 704 | 34.09% |
| 60 | 360 | 64 | 704 | 51.14% |
| 64 | 384 | 64 | 704 | 54.55% |
| 72 | 360 | 128 | 1664 | 21.63% |
| 84 | 504 | 128 | 1664 | 30.29% |
| 96 | 576 | 128 | 1664 | 34.62% |
| 108 | 756 | 128 | 1664 | 45.43% |
| 120 | 840 | 128 | 1664 | 50.48% |

As previously explained, if one attempts to implement a belief propagation interconnection network of a parallel decoder with a general Clos network, complex issues arise, both in terms of hardware complexity of the switch fabric, and, even more critically, in routing commands generation, since it is quite complex to determine a routing algorithm.

Instead, the present invention allows to implement a much lighter and much simpler interconnection network provided with non-blocking properties (in fact, an interconnection network according to the present invention is non-blocking for the routing rule imposed by the code interleaver mathematical description).

Moreover, again as previously explained, banyan networks (even though represent a light implementation solution among generally blocking networks), are rigidly based on a power-of-two factorization and, hence, does not allow a general factorization. Also the barrel shifter solutions (although represent a very efficient kind of networks), used in Arithmetic Logic Units (ALUs) of computers, are based on a power-of-two factorization and generate logarithmic complexity structures that do not fit the general case.

Instead, the present invention introduces a fully general network whose factorization is generally realizable, has minimum hardware implementation requirements with respect to the other existing solutions and, in addition, introduces a hard wiring that fully substitutes one of the network stages of a Clos network and allows a very efficient self-routing algorithm. The hard wiring is made possible by fully exploiting the typical interleaver laws of CCSDS or DVB standards (Ref10, Ref11, Ref12).

Hence, for the most general size factorization, the present invention provides minimum hardware complexity along with a simple self-routing algorithm.

In particular, banyan networks and barrel shifters solutions, not endowed with general flexibility on the number of inputs, do not allow any possibility of achieving the desired interleaver law and incur critical blocks. The present invention, instead, can match a general size interleaver, with the only limitation related to a non-prime number of inputs or, which is the same, a non-prime degree of interleaver parallelism.

The present invention guarantees the exploitation of the interleaver algorithm properties in the best way to reduce to a minimum the hardware complexity of the switch fabric by completely eliminating one of the stages of a Clos network and completely cancelling some of the routing algorithm computations required for a Clos network. In particular, the routing algorithm section that is cancelled is actually the most critical one, while the computations still to be executed are simply obtainable by self-routing procedures.

In addition, the present invention provides for a scalable design that is highly desirable to obtain the best trade-off among hardware parallelism, resources requirements and decoder throughput on the basis of the specific target digital technology, that typically varies with the improvement of the digital technology.

In particular, the interconnection network according to the present invention is able to implement self-routing in real-time. With this approach, the major constraint to the data rate is the maximum operating frequency of the target technology, since the interconnection network according to the present invention requires very limited hardware resources (i.e., logic elements) and no specific routing algorithms computation.

As previously described, the invention is mainly aimed to the implementation of a core element of an iterative FEC encoder/decoder, i.e., the interconnection network. This network is necessary in order to exchange data and simultaneously realize the required data interleaving function during the iterative elaboration process. More in detail, the interconnection network according to the present invention has N inputs and N outputs and is able to provide an output vector of size N that is a circularly shifted replica of the input vector of size N. The number of positions to be shifted can be any value in the range of size [0;N−1]. The interconnection network according to the present invention allows very high throughput performing any generic shift in only one clock cycle; at the same time, it minimizes the required hardware resources considering both the interconnection network architecture and the relevant control logic, being the last necessary to implement the simultaneous setting of all the internal elements for the required shift.

Thence, the interconnection network according to the present invention represents the most efficient solution as for hardware and the most simple as for routing, is suitable for all FEC technologies, and does not impose restrictions on the number of inputs or parallelism degree, thereby being applicable to all high speed coding solutions.

The present invention can be implemented in all the existing (and future) very-large-scale integration (VLSI) technologies, in particular by means of devices based on ASIC and FPGA technologies.

The present invention can be advantageously exploited in all the applications and devices in which high throughput FEC encoders/decoders are required, such as:
high data rate modem (for satellite and ground applications);
optical communications (both free space and fibre based);
digital storage devices for high speed data retrieval and recording.

As for space applications, earth observation missions may greatly takes advantage of the present invention, because the large volumes of generated observation data and the reduced visibility time with the ground stations (since LEO orbits are typically used) require the use of extremely high data rates (for example, from 300/500 Mbps up to 1 Gbps, or even more for future missions). Therefore, the present invention could be a crucial element for the feasibility of Earth observation high data rate communication systems.

In conclusion, it is clear that numerous modifications and variants can be made to the present invention, all falling within the scope of the invention, as defined in the appended claims.

The invention claimed is:

1. An interconnection network for forward error correction encoders and decoders, including N input terminals, N output terminals, and M stages;
wherein N is a non-prime positive integer, and wherein M is a positive integer equal to, or higher than, two;
wherein the M stages include a first stage and a last stage and wherein each stage includes switching elements having, each, respective input pins and respective output pins;
wherein the input pins of the switching elements of the first stage are connected to the input terminals, and the output pins of the switching elements of the last stage are connected to the output terminals;
wherein, the input and output pins of the switching elements of immediately successive stages are connected in a hardwired fashion so as to form a plurality of interconnection sub-networks for routing, each, respective input values from respective output pins of the switching elements of the first stage to respective input pins of the switching elements of the last stage;
whereby the interconnection network is operable to route, on the basis of routing commands applied to the switching elements, N input values received at the N input terminals through the M stages and the interconnection sub-networks to provide, at the N output terminals, N output values corresponding to, or circularly shifted with respect to, said N input values received at the N input terminals;
characterized in that M denotes a number of given submultiples of N whose product is equal to N;
wherein each stage is associated with a respective submultiple of said M given submultiples of N, and includes $S_i$ switching elements, each having $sm_i$ respective input pins and $sm_i$ respective output pins, wherein $S_i=N/sm_i$, wherein $sm_i$ denotes said respective submultiple associated with said stage, and wherein i denotes said stage and is a positive integer comprised between one and M;
wherein each switching element is configured to:
receive, at the $sm_i$ respective input pins, $sm_i$ respective input values; and provide at the $sm_i$ respective output pins, on the basis of a respective routing command applied to said switching element, $sm_i$ respective output values corresponding to, or circularly shifted with respect to, said $sm_i$ respective input values received at the $sm_i$ respective input pins;

wherein the interconnection sub-networks are not connected to each other;

wherein the interconnection network includes $sm_1$ interconnection sub-networks for routing, each, $N/sm_1$ respective input values from $N/sm_1$ respective output pins of the switching elements of the first stage to $N/sm_i$ respective input pins of the switching elements of the last stage; wherein $sm_1$ denotes the submultiple, among said M given submultiples of N, which is associated with the first stage; and wherein at least one of:
(i) the stages are arranged, from the first stage to the last stage, according to a decreasing or increasing order of said M given submultiples of N;
(ii) the stages are arranged, from the first stage to the last stage, according to a decreasing order of said M given submultiples of N, whereby the first stage is associated with the greatest submultiple among said M given submultiples of N;
(iii) the interconnection network includes three or more stages thereby resulting in M being equal to, or higher than, three; wherein each interconnection sub-network includes, at each stage different than the first and the last stages, $$\prod_{k=1}^{i} sm_k$$

switching elements of said stage, wherein i denotes said stage and is a positive integer comprised between two and M−1;

and wherein, at each stage different than the first and the last stages, the switching elements of said stage included in each interconnection sub-network have, each,
the $sm_i$ respective input pins connected, in a hardwired fashion, to respective output pins of $sm_i$ respective switching elements of an immediately previous stage, and
the $sm_i$ respective output pins connected, in a hardwired fashion, to respective input pins of $sm_i$ respective switching elements of an immediately successive stage;

(iv) N is different from a power of two; or
(v) each switching element includes $sm_i$ respective multiplexers, each of which is:
connected to all the $sm_i$ respective input pins of said switching element;
connected to a respective output pin of the $sm_i$ respective output pins of said switching element; and
operable to connect the respective output pin to one of said $sm_i$ respective input pins of the switching element, depending on the respective routing command applied to said switching element.

2. The interconnection network of claim 1, wherein the first stage is associated with the greatest submultiple among said M given submultiples of N.

3. A routing method for the interconnection network as claimed in claim 1; said routing method comprising:
computing, for each switching element, a respective routing command based on:
an overall circular shift to be applied by the interconnection network to the N input values received at the N input terminals,
the respective stage which said switching element belongs to, and
a respective identifier of the switching element, which respective identifier is related to
the respective stage which said switching element belongs to, or
the respective stage and the respective interconnection sub-network which said switching element belongs to; and
applying, to each switching element, the respective routing command computed, wherein said respective routing command is indicative of a circular shift to be applied by said switching element to the $sm_i$ respective input values received at the $sm_i$ respective input pins.

4. A forward error correction encoder comprising the interconnection network as claimed in claim 1.

5. A forward error correction decoder comprising the interconnection network as claimed in claim 1.

\* \* \* \* \*